US008927366B2

(12) United States Patent
Lee et al.

(10) Patent No.: US 8,927,366 B2
(45) Date of Patent: Jan. 6, 2015

(54) METHOD OF MANUFACTURING A NON-VOLATILE MEMORY DEVICE HAVING A VERTICAL STRUCTURE

(75) Inventors: Sung-hae Lee, Suwong-si (KR); Ki-hyun Hwang, Seongnam-si (KR); Jin-gyun Kim, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 221 days.

(21) Appl. No.: 13/610,344

(22) Filed: Sep. 11, 2012

(65) Prior Publication Data

US 2013/0089974 A1 Apr. 11, 2013

(30) Foreign Application Priority Data

Oct. 11, 2011 (KR) ........................ 10-2011-0103600

(51) Int. Cl.
*H01L 21/04* (2006.01)
*H01L 27/115* (2006.01)

(52) U.S. Cl.
CPC .... *H01L 27/11556* (2013.01); *H01L 27/11582* (2013.01)
USPC ....... 438/270; 438/510; 438/682; 257/E21.04

(58) Field of Classification Search
CPC .................. H01L 27/11582; H01L 27/11556
USPC ......................................... 438/270, 510, 682
See application file for complete search history.

(56) References Cited

U.S. PATENT DOCUMENTS

| 8,492,797 | B2 * | 7/2013 | Hwang et al. ................. 257/208 |
| 8,564,046 | B2 * | 10/2013 | Kim et al. ....................... 257/324 |
| 2012/0276696 | A1 * | 11/2012 | Yang et al. ..................... 438/156 |
| 2012/0329224 | A1 * | 12/2012 | Kong et al. .................... 438/268 |
| 2013/0234279 | A1 * | 9/2013 | Kim et al. ....................... 257/491 |
| 2013/0286735 | A1 * | 10/2013 | Hwang et al. ............ 365/185.05 |
| 2014/0169105 | A1 * | 6/2014 | Oh ............................ 365/185.29 |

FOREIGN PATENT DOCUMENTS

| JP | 2008-159699 | 7/2008 |
| JP | 2010-199311 | 9/2010 |
| JP | 2010-199314 | 9/2010 |
| KR | 1020100079393 | 7/2010 |

* cited by examiner

*Primary Examiner* — Alexander Ghyka
(74) *Attorney, Agent, or Firm* — P. Chau & Associates, LLC

(57) ABSTRACT

A method of manufacturing a non-volatile memory device, wherein the method includes: alternately stacking interlayer sacrificial layers and interlayer insulating layers on a substrate; forming a plurality of first openings that pass through the interlayer sacrificial layers and the interlayer insulating layers to expose a first portion of the substrate; forming a semiconductor region on a side wall and a lower surface of each of the first openings; forming an embedded insulating layer in each of the first openings; forming a first conductive layer on the embedded insulating layer inside each of the first openings; forming a second opening exposing a second portion of the substrate and forming an impurity region on the second portion; forming a metal layer to cover the first conductive layer and the impurity region; and forming the metal layer into a metal silicide layer.

8 Claims, 19 Drawing Sheets

METHOD OF MANUFACTURING A NON-VOLATILE MEMORY DEVICE HAVING A VERTICAL STRUCTURE

CROSS-REFERENCE TO RELATED APPLICATION

This application claims priority under 35 U.S.C. §119 to Korean Patent Application No. 10-2011-0103600, filed on Oct. 11, 2011, in the Korean Intellectual Property Office, the disclosure of which is incorporated by reference herein in its entirety.

BACKGROUND

1. Technical Field

The inventive concept relates to a method of manufacturing a non-volatile memory device, and more particularly, to a method of manufacturing a non-volatile memory device having a vertical channel structure.

2. Discussion of the Related Art

Certain electronic products are required to have a small size and large data processing capability. Thus, it may be desirable to increase a degree of integration of semiconductor memory devices used in such electronic products. For example, a non-volatile memory device having a vertical transistor structure instead of a horizontal transistor structure has been proposed to improve integration in semiconductor memory devices.

SUMMARY

An exemplary embodiment of the inventive concept provides a method of manufacturing a non-volatile memory device having a vertical structure, decreased pad resistance and contact resistance, and improved current characteristics.

An exemplary embodiment of the inventive concept provides a method of manufacturing a non-volatile memory device, the method comprising: alternately stacking interlayer sacrificial layers and interlayer insulating layers on a substrate; forming a plurality of first openings that pass through the interlayer sacrificial layers and the interlayer insulating layers to expose a first portion of the substrate; forming a semiconductor region on a side wall and a lower surface of each of the first openings; forming an embedded insulating layer in each of the first openings; forming a first conductive layer on the embedded insulating layer inside each of the first openings; forming a second opening exposing a second portion of the substrate and forming an impurity region on the second portion; forming a metal layer to cover the first conductive layer and the impurity region; and forming the metal layer into a metal silicide layer.

The method further comprising, between the forming of the metal layer to cover the first conductive layer and the impurity region and the forming of the metal layer into the metal silicide layer, forming a capping film on the metal layer.

The forming of the metal layer into the metal silicide layer comprises performing a heat treatment process to form the metal layer on the first conductive layer and the impurity region into the metal silicide layer.

In the forming of the metal layer on the first conductive layer and the impurity region into the metal silicide layer, the first conductive layer is completely or incompletely formed into the metal silicide layer.

In the forming of the metal layer on the first conductive layer and the impurity region into the metal silicide layer, at least a portion of the first conductive layer and the semiconductor region is formed into the metal silicide layer.

The method further comprising: forming a bit line that is electrically connected to the metal silicide layer on the first conductive layer; and forming an embedded insulating layer on the metal silicide layer on the impurity region.

The method further comprising, between the forming of the second opening exposing the second portion of the substrate and the forming of the impurity region on the second portion, forming side surface openings between the interlayer insulating layers by removing the interlayer sacrificial layers exposed by the second opening; forming a gate dielectric film on a side wall of the second opening and the side surface openings; filling the second opening and the side surface openings with a conductive material; and forming a third opening by removing some of the conductive material and implanting an impurity into the substrate through the third opening to form the impurity region.

The gate dielectric film comprises a tunneling insulating layer, a charge storage layer, and a blocking insulating layer sequentially stacked in this order from the semiconductor region.

An exemplary embodiment of the inventive concept provides a method of manufacturing a non-volatile memory device, the method comprising: alternately stacking interlayer sacrificial layers and interlayer insulating layers on a substrate; forming a plurality of first openings that pass through the interlayer sacrificial layers and the interlayer insulating layers to expose a first portion of the substrate; forming a semiconductor region on a side wall and a lower surface of each of the first openings; forming an embedded insulating layer in each of the first openings; forming a first conductive layer on the embedded insulating layer inside each of the first openings; and forming a metal layer to cover the first conductive layer.

The method further comprising, after the forming of the metal layer to cover the first conductive layer, forming a second conductive layer by removing a portion of the metal layer which does not contact the first conductive layer.

The method further comprising, after the forming of the metal layer, forming the metal layer into a metal silicide layer.

The method further comprising forming a bit line that is electrically connected to the metal silicide layer on the first conductive layer.

The method further comprising, after the forming of the metal layer to cover the first conductive layer, forming a second opening exposing a second portion of the substrate; forming side surface openings between the interlayer insulating layers by removing the interlayer sacrificial layers exposed by the second opening; forming a gate dielectric film on the second opening and the side surface openings; filling the second opening and the side surface openings with a conductive material; and forming a third opening by removing the conductive material in the second opening and implanting an impurity into the substrate through the third opening to form an impurity region.

The forming of the metal layer into the metal silicide layer comprises performing a heat treatment process to form the metal layer on the first conductive layer into the metal silicide layer.

In the performing of the heat treatment process to form the metal layer on the first conductive layer into the metal silicide layer, the first conductive layer and all or a portion of the semiconductor region surrounding the first conductive layer are formed into the metal silicide layer.

An exemplary embodiment of the inventive concept provides a method of manufacturing a memory device, the method comprising: alternately arranging a plurality of interlayer sacrificial layers and interlayer insulating layers in a stacked fashion on a substrate; forming first and second openings that pass through the interlayer sacrificial and insulating layers to expose first and second portions of the substrate, respectively; forming a semiconductor in each of the first and second openings; forming a insulating layer in each of the first and second openings; forming a first conductive layer on the insulating layer in each of the first and second openings; and forming a metal silicide layer on the first conductive layer.

The metal silicide layer is formed by performing a heat treatment process on a metal layer disposed on the first conductive layer.

The method further comprising, after forming the first conductive layer, forming a third opening between the first and second openings, wherein the third opening exposes a third portion of the substrate, forming an impurity region on the third portion and forming a metal silicide layer on the impurity region simultaneous with the forming of the metal silicide layer on the first conductive layer.

The method further comprising, after forming the metal silicide layer, forming a third opening between the first and second openings, wherein the third opening exposes a third portion of the substrate, forming an impurity region on the third portion and forming a metal silicide layer on the impurity region.

A gate dielectric film is formed on a side of each of the semiconductors, wherein the gate dielectric film includes a tunnel insulating layer, charge storage layer and blocking insulating layer sequentially stacked from the side.

BRIEF DESCRIPTION OF THE DRAWINGS

The above and other features of the inventive concept will become more apparent by describing in detail exemplary embodiments thereof with reference to the accompanying drawings in which.

DETAILED DESCRIPTION OF THE EMBODIMENTS

Figure 1:
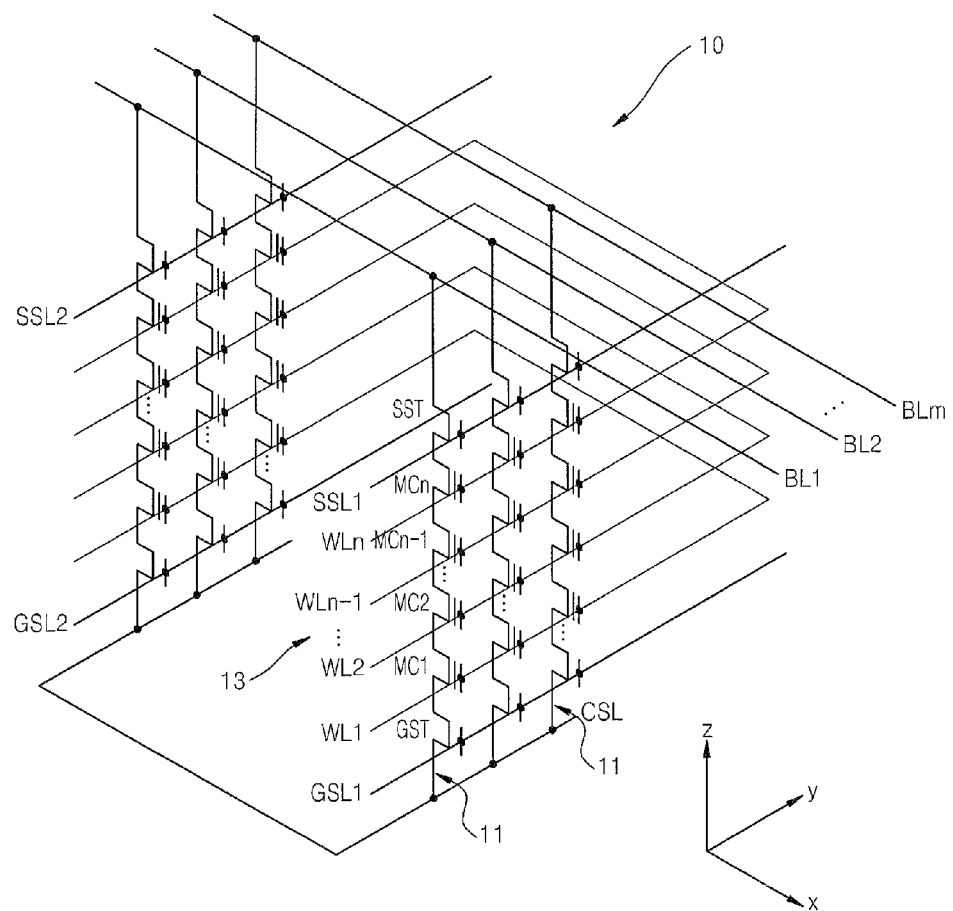
FIG. 1 is an equivalent circuit diagram of a memory cell array of a non-volatile memory device according to an exemplary embodiment of the present inventive concept.

Hereinafter, exemplary embodiments of the present inventive concept will be described in detail with reference to the accompanying drawings. The inventive concept may, however, be embodied in many different forms, and should not be construed as being limited to the embodiments set forth herein.

Like reference numerals may denote like elements throughout the specification and drawings.

FIG. 1 is an equivalent circuit diagram of a memory cell array 10 of a non-volatile memory device according to an exemplary embodiment of the present inventive concept. In the present embodiment, a vertical-type NAND flash memory device having a vertical channel structure is used as an example of the non-volatile memory device.

Referring to FIG. 1, the memory cell array 10 may include a plurality of memory cell strings 11. The memory cell strings 11 may extend in a vertical direction (in other words, a z direction) with respect to an extension direction (in other words, x and y directions) of a main surface of a substrate (not shown). The memory cell strings 11 may constitute a memory cell block 13.

The memory cell strings 11 may each include a plurality of memory cells MC1 through MCn, a string selection transistor SST, and a ground selection transistor GST. For each of the memory cell strings 11, the ground selection transistor GST, the memory cells MC1 through MCn, and the string selection transistor SST may be vertically (in other words, the z direction) arranged in series. In this regard, the memory cells MC1 through MCn may store data. A plurality of word lines WL1 through WLn may be connected to and may control the memory cells MC1 through MCn, respectively. The number of memory cells MC1 through MCn may vary depending on the capacity of a semiconductor memory device.

On ends of the memory cell strings 11 arranged on first through $m^{th}$ columns of the memory cell block 13, for example, on a drain of the string selection transistor SST, may be connected a plurality of bit lines BL1 through BLm extending in the x direction, respectively. In addition, on the other ends of the memory cell strings 11, for example, on a source of the ground selection transistor GST, may be connected a common source line CSL.

The word lines WL1 through WLn extending in the y direction may be commonly connected to gates of memory cells MC1 through MCn that are arranged on the same plane from among the memory cells MC1 through MCn of the memory cell strings 11. Depending on an operation of the word lines WL1 through WLn, data may be programmed in the memory cells MC1 through MCn, or may be read or erased from the memory cells MC1 through MCn.

In each of the memory cell strings 11, the string selection transistor SST may be arranged between the bit lines BL1 through BLm and the memory cells MC1 through MCn. In the memory cell block 13, the string selection transistor SST may control data transmission between the bit lines BL1 through BLm and the memory cells MC1 through MCn, through string selection lines SSL1 and SSL2 connected to a gate of the string selection transistor SST.

The ground selection transistor GST may be arranged between the memory cells MC1 through MCn and the common source line CSL. In the memory cell block 13, the ground selection transistor GST may control data transmission between the memory cells MC1 through MCn and the common source line CSL through ground selection lines GSL1 and GSL2 connected to a gate of the ground selection transistor GST.

Figure 2:
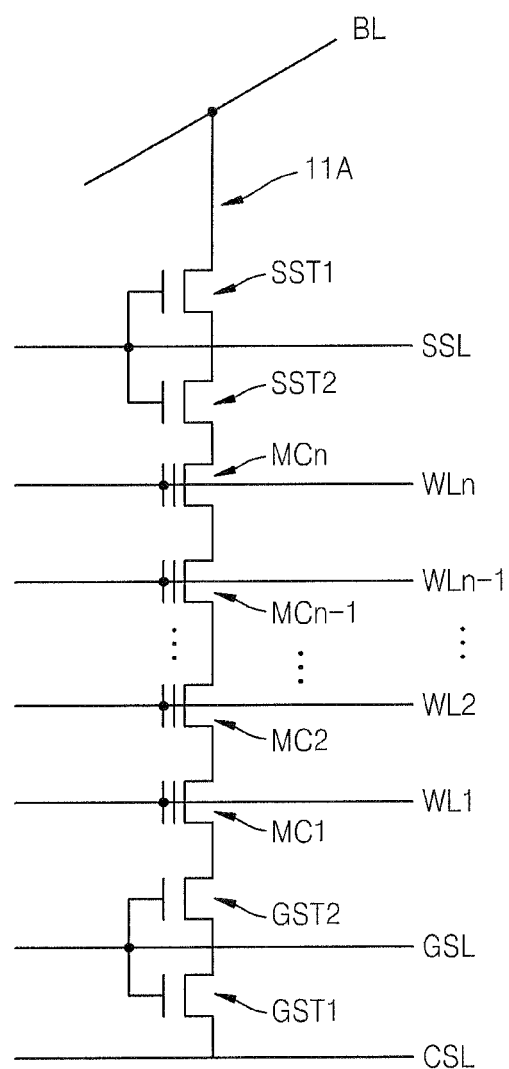
FIG. 2 is an equivalent circuit diagram of a memory cell array of a non-volatile memory device according to an exemplary embodiment of the present inventive concept.

FIG. 2 is an equivalent circuit diagram of a memory cell array of a non-volatile memory device according to an exemplary embodiment of the present inventive concept. FIG. 2 illustrates an equivalent circuit diagram of a memory cell string 11A included in a vertical-type NAND flash memory device having a vertical channel structure.

In FIGS. 1 and 2, like reference numerals denote like elements. Accordingly, the elements that have been described with reference to FIG. 1 may not be repeatedly described.

The string selection transistor SST illustrated in FIG. 1 is a single transistor. However, referring to FIG. 2, instead of the string selection transistor SST illustrated in FIG. 1, a pair of string selection transistors SST1 and SST2 are arranged in series between bit lines BL1, BL2, . . . , BLm−1, BLm and memory cells MC1, MC2, . . . , MCn−1, MCn. In this case, the string selection line SSL may be commonly connected to gates of the string selection transistors SST1 and SST2. In this regard, the string selection line SSL may correspond to the first string selection line SSL1 or the second string selection line SSL2 illustrated in FIG. 1.

In addition, the ground selection transistor GST illustrated in FIG. 1 is a single transistor. However, referring to FIG. 2, instead of the ground selection transistor GST in FIG. 1, a pair of ground selection transistors GST1 and GST2 are arranged in series between the memory cells MC1, MC2, . . . , MCn−1, and MCn and the common source line CSL. In this case, the ground selection line GSL may be commonly connected to gates of the ground selection transistors GST1 and GST2. The ground selection line GSL may correspond to the first ground selection line GSL1 or the second ground selection line GSL2 illustrated in FIG. 1.

In FIG. 2, the bit line BL may correspond to any one of the bit lines BL1, BL2, . . . , BLm-1, BLm illustrated in FIG. 1.

Figure 3:
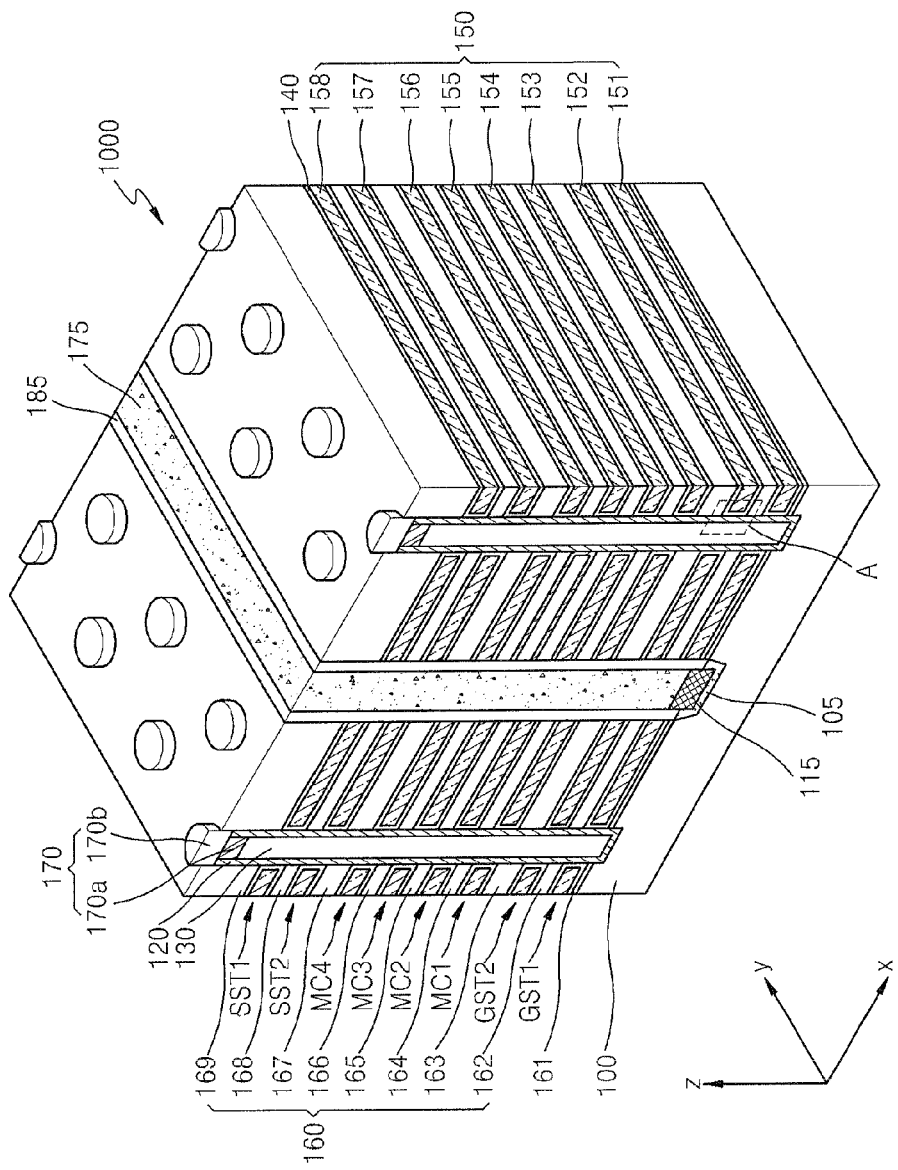
FIG. 3 is a perspective view illustrating a three-dimensional structure of memory cell strings of a non-volatile memory device according to an exemplary embodiment of the present inventive concept.

FIG. 3 is a perspective view illustrating a three-dimensional structure of memory cell strings of a non-volatile memory device 1000 according to an exemplary embodiment of the present inventive concept.

In FIG. 3, some elements that constitute the memory cell strings 11 illustrated in FIG. 1 may not be illustrated. For example, the bit lines BL1, BL2, . . . , BLm−1, BLm that are connected to the memory cell strings 11 are not illustrated.

Referring to FIG. 3, the non-volatile memory device 1000 may include a semiconductor region 120 disposed on a substrate 100, and a plurality of memory cell strings disposed along a side surface of the semiconductor region 120. The semiconductor region 120 may be used as a channel for the memory cell strings. The memory cell strings may extend in the y direction along the side surface of the semiconductor regions 120 arranged in the y direction. In addition, along the side surface of the semiconductor region 120, the memory cell strings 11 (see FIG. 1) extending from the substrate 100 in the z direction may be arranged. Each of the memory cell strings 11 may include two ground selection transistors GST1 and GST2, a plurality of memory cells MC1, MC2, MC3, MC4, and two string selection transistors SST1 and SST2. According to an exemplary embodiment of the inventive concept, one of the ground selection transistors GST1 and GST2 and one of the string selection transistors SST1 and SST2 may be included.

The main surface of the substrate 100 may extend in the x direction and the y direction. The substrate 100 may include a semiconductor material, for example, a Group IV semiconductor, a Group III through V compound semiconductor or a Group II through VI oxide semiconductor. For example, the Group IV semiconductor may include silicon, germanium, or a combination thereof. The substrate 100 may be provided as a bulk wafer or an epitaxial layer.

The semiconductor region 120 may have a pillar shape and may be disposed on the substrate 100 to extend in the z direction. A plurality of the semiconductor regions 120 may be spaced apart from each other in the x direction and the y direction, for example, they may be disposed in a zig-zag form in the y direction. In other words, the semiconductor regions 120 arranged in the y direction may be off-set from each other.

In addition, according to the present embodiment, the semiconductor regions 120 are arranged off-set in two columns However, the arrangement of the semiconductor regions 120 is not limited thereto, and the semiconductor regions 120 may have various other arrangements. For example, the semiconductor regions 120 may be arranged in one column in the y direction, or may be arranged off-set in a zig-zag form in 3 or more columns.

The semiconductor region 120 may have, for example, a cylinder shape having an open upper portion. However, the shape of the semiconductor region 120 is not limited thereto, and the semiconductor region 120 may have a square pillar shape, or the semiconductor region 120 may be formed on only facing side surfaces and a lower surface of a square pillar.

The semiconductor region 120 may have a lower surface that directly contacts the substrate 100 so that the semiconductor region 120 may be electrically connected to the substrate 100. The semiconductor region 120 may include a semiconductor material, such as polysilicon or mono-crystalline silicon, and the semiconductor material may not be doped with or may include a p-type or n-type impurity.

An embedded insulating layer 130 may be formed by filling a portion of the inside of the semiconductor region 120. The embedded insulating layer 130 may include undoped silica glass (USG), spin on glass (SOG), or tonen silazene (TOSZ). According to a modified example of the present embodiment, before the embedded insulating layer 130 is formed filling the semiconductor region 120, hydrogen annealing may be performed on a resultant structure including the semiconductor region 120. In other words, the resultant structure may be heat treated in a gas atmosphere including hydrogen or deuterium. Due to the hydrogen annealing, crystal defects present in the semiconductor region 120 may be removed.

A conductive layer 170 may be formed on an upper surface of the embedded insulating layer 130 and may be electrically connected to the semiconductor region 120. The conductive layer 170 may include a first conductive layer 170a and a second conductive layer 170b.

The first conductive layer 170a may include a doped polysilicon or an undoped polysilicon. Alternatively, the first conductive layer 170a may be a combination of a doped polysilicon and an undoped polysilicon.

The second conductive layer 170b may be formed on the first conductive layer 170a and may include metal silicide. The metal silicide may be formed by using cobalt (Co), palladium (Pd), platinum (Pt), nickel (Ni), titanium (Ti), molybdenum (Mo), tantalum (Ta), tungsten (W), or the like.

According to the present embodiment, due to the inclusion of metal silicide in the conductive layer 170, the conductive layer 170 may reduce its resistance and also, may reduce a contact resistance between bit lines (not shown) that electrically contact the conductive layer 170. In addition, when the conductive layer 170 including metal silicide is formed, compared to a case in which only doped polysilicon is used, an ion implantation process may not be required. Thus, this process may be simplified and its costs may also be reduced.

In addition, compared to a conductive layer including doped polysilicon, current scattering may be minimized Thus, characteristics of a non-volatile memory device may be improved.

In addition, the conductive layer 170 may function as a drain region of the string selection transistor SST1.

The first string selection transistors SST1 arranged in the x direction may be commonly connected to the bit lines BL1 through BLm (see FIG. 1). In addition, the first ground selection transistors GST1 arranged in the x direction may be electrically connected to an impurity region 105 disposed adjacent to the first ground selection transistors GST1.

Impurity regions 105 may be disposed adjacent to the main surface of the substrate 100, may extend in the y direction, and may be arranged spaced apart from each other in the x direction. The impurity regions 105 may be arranged in such a way that one impurity region is interposed between every two adjacent semiconductor regions 120 in the x direction. The impurity region 105 may be a source region and may form a PN junction with another region of the substrate 100. The impurity region 105 may include a high-concentration impurity region (not shown) that is adjacent to the main surface of the substrate 100 and is located at the center of the impurity region 105, and a low-concentration impurity region (not shown) that is disposed at opposite sides of the high-concentration impurity region.

A second conductive layer 115 may be formed on the impurity region 105. The second conductive layer 115 may provide a source region to the ground selection transistors GST1 and GST2 of memory cell strings on side surfaces of two adjacent semiconductor regions 120 in the x direction. The second conductive layer 115 may extend along the impurity region 105 in the y direction. The second conductive layer 115 may include metal silicide. The metal silicide may be formed by using cobalt (Co), palladium (Pd), platinum (Pt), nickel (Ni), titanium (Ti), molybdenum (Mo), tantalum (Ta), tungsten (W), or the like. In addition, the second conductive layer 115 may include metal. In addition, the second conductive layer 115 may function as a common source line.

The second conductive layer 170b on the first conductive layer 170a and the second conductive layer 115 on the impurity region 105 may be formed simultaneously or separately according to characteristics of a process.

In addition, an embedded insulating layer 175 may be formed on the second conductive layer 115.

According to the present embodiment, the structure of the embedded insulating layer 175 may not be limited to the illustrated structure, and the embedded insulating layer 175 may also have various other structures. For example, the embedded insulating layer 175 may be formed in the y direction on only a portion of the second conductive layer 115.

In addition, insulation regions 185 having a spacer shape may be formed on side walls of a gate electrode 151 of the ground selection transistor GST1, and the embedded insulating layer 175 may be formed with a predetermined height between the insulation regions 185. Furthermore, the insulation regions 185 are formed extending up to the upper most interlayer insulating layer 169, and the embedded insulating layer 175 is formed between the insulation regions 185. In other words, the insulation regions 185 may be formed between adjacent memory cell strings using different semiconductor regions 120.

In FIG. 3, adjacent semiconductor regions 120 are symmetrically disposed about the insulation regions 185. However, the present inventive concept is not limited thereto. For example, adjacent semiconductor regions 120 may be non-symmetrically disposed about the insulation regions 185.

A plurality of gate electrodes 151 through 158 (150) may be arranged along a side surface of the semiconductor region 120 from the substrate 100 in the z direction and may be spaced apart from each other in the z direction. The gate electrodes 150 may be gate electrodes of the ground selection transistors GST1 and GST2, the memory cells MC1, MC2, MC3, and MC4, and the string selection transistors SST1 and SST2, respectively.

The gate electrodes 150 may be commonly connected to adjacent memory cell strings arranged in the y direction. The gate electrodes 157 and 158 of the string selection transistors SST1 and SST2 may be connected to the string selection line SSL (see FIG. 2). The gate electrodes 153, 154, 155, and 156 of the memory cells MC1, MC2, MC3, and MC4 may be connected to the word lines WL1, WL2, WLn−1, and WLn (see FIG. 2). The gate electrodes 151 and 152 of the ground selection transistors GST1 and GST2 may be connected to the ground selection line GSL (see FIG. 2).

The gate electrodes 150 may include metal, for example, tungsten (W). In addition, although not illustrated, the gate electrodes 150 may each further include a diffusion barrier (not shown), and for example, the diffusion barrier may include tungsten nitride (WN), tantalum nitride (TaN), or titanium nitride (TiN).

A gate dielectric film 140 may be disposed between the semiconductor region 120 and the gate electrodes 150. The gate dielectric film 140 may include a tunneling insulating layer 142 (see FIG. 4), a charge storage layer 144 (see FIG. 4), and a blocking insulating layer 146 (see FIG. 4), which are sequentially deposited in this order on the semiconductor region 120.

A plurality of interlayer insulating layers 161 through 169 (160) may be arranged among, on, or under the gate electrodes 150. The interlayer insulating layers 160, like the gate electrodes 150, may be arrayed in such a way that the interlayer insulating layers 160 are spaced from each other in the z direction and extend in the y direction. A side surface of each of the interlayer insulating layers 160 may contact the semiconductor region 120. The interlayer insulating layers 160 may include silicon oxide or silicon nitride.

In FIG. 3, four memory cells MC1, MC2, MC3, and MC4 are arranged. However, the number of memory cells is not limited thereto and depending on the capacity of the non-volatile memory device 1000, a greater or smaller number of memory cells may be arrayed.

In addition, each of the memory cell strings includes a pair of string selection transistors SST1 and SST2, and a pair of ground selection transistors GST1 and GST2. Because the number of string selection transistors SST1 and SST2 is two or more and the number of ground selection transistors GST1 and GST2 is two or more, lengths of the selection gate electrodes 151, 152, 157, and 158 may be substantially reduced compared to a case when one string selection transistor and one ground selection transistor are used, so that intervals between the interlayer insulating layers 160 may be filled without voids. However, the present inventive concept is not limited thereto. For example, like the memory cell strings illustrated in FIG. 1, one string selection transistor SST and one ground selection transistor GST may be included. In addition, the string selection transistor SST and the ground selection transistor GST may have different structures from those of the memory cells MC1, MC2, MC3, and MC4.

Figure 4:
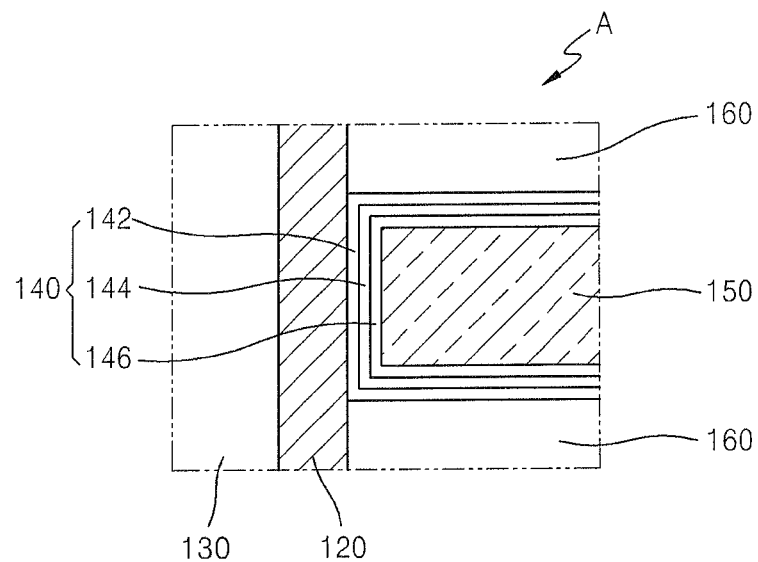
FIG. 4 is an enlarged cross-sectional view of a portion A of FIG. 3 for explaining a gate dielectric film illustrated in FIG. 3.
Figure 5:
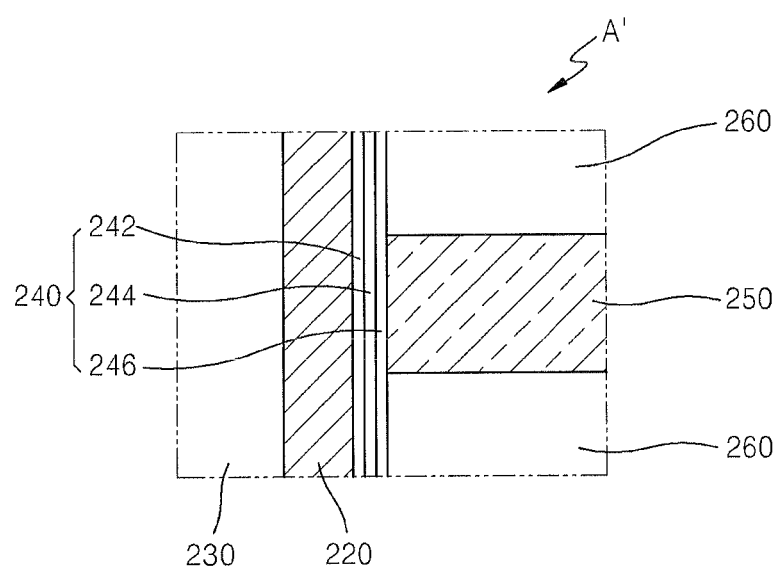
FIG. 5 is an enlarged view of a variant of portion A, i.e., a portion A', showing a gate dielectric film according to an exemplary embodiment of the present inventive concept.

FIG. 4 is an enlarged cross-sectional view of a portion A of FIG. 3, illustrating the gate dielectric film 140 illustrated in FIG. 3, according to an exemplary embodiment of the present inventive concept, and FIG. 5 is an enlarged view of a variant of portion A, i.e., a portion A', showing a gate dielectric film according to an exemplary embodiment of the present inventive concept.

Referring to FIG. 4, the semiconductor region 120 used as a channel of memory cell strings is illustrated. The embedded insulating layer 130 may be disposed on a left side surface of the semiconductor region 120. The gate dielectric film 140 may be disposed on a portion of a right side surface of the semiconductor region 120. In addition, the interlayer insulating layers 160 may contact the right side surface of the semiconductor region 120 and may be disposed on and under the gate dielectric film 140. The gate dielectric film 140 may include the tunneling insulating layer 142, the charge storage layer 144, and the blocking insulating layer 146, which are sequentially stacked in this order from the right side surface of the semiconductor region 120.

The tunneling insulating layer 142 may allow charges to tunnel to the charge storage layer 144 in an F-N manner. The tunneling insulating layer 142 may include silicon oxide ($SiO_2$), silicon nitride ($Si_3N_4$), silicon oxynitride (SiON), hafnium oxide ($HfO_2$), hafnium silicate ($HfSi_xO_y$), aluminum oxide ($Al_2O_3$), or zirconium oxide ($ZrO_2$). The tunneling insulating layer 142 may be a single layer or a composite layer.

The charge storage layer 144 may be a charge trapping layer or a floating gate conductive film. If the charge storage layer 144 is a floating gate conductive film, the charge storage layer 144 may be formed by chemical vapor deposition (CVD), for example, by depositing polycrystalline silicon by low-pressure chemical vapor deposition (LPCVD) using $SiH_4$ or $Si_2H_6$ and $PH_3$ gas. If the charge storage layer 144 is a charge trapping layer, the charge storage layer 144 may include silicon oxide ($SiO_2$), silicon nitride ($Si_3N_4$), silicon oxynitride (SiON), hafnium oxide ($HfO_2$), zirconium oxide ($ZrO_2$), tantalum oxide ($Ta_2O_3$), titanium oxide ($TiO_2$), hafnium aluminum oxide ($HfAl_xO_y$), hafnium tantalum oxide ($HfTa_xO_y$), hafnium silicate ($HfSi_xO_y$), aluminum nitride ($Al_xN_y$), or aluminum gallium nitride ($AlGa_xN_y$). Alternatively, the charge storage layer 144 may include quantum dots or nanocrystals. In this regard, the quantum dots or nanocrystals may be constituted with a conductive material, for example, micro particles of metal or semiconductor.

The blocking insulating layer 146 may include silicon oxide ($SiO_2$), silicon nitride ($Si_3N_4$), silicon oxynitride (SiON), a high-k dielectric material, or a combination thereof. Herein, the high-k dielectric material refers to a dielectric material that has a higher dielectric constant than that of a silicon oxide film. The blocking insulating layer 146 may include a material that has a higher dielectric constant than that of the tunneling insulating layer 142. The high-k dielectric material of the blocking insulating layer 146 may include aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicate ($ZrSi_xO_y$), hafnium oxide ($HfO_2$), hafnium silicate ($HfSi_xO_y$), lantanum oxide ($La_2O_3$), lantanum aluminum oxide ($LaAlO_y$), lantanum hafnium oxide ($LaHf_xO_y$), hafnium aluminum oxide ($HfAl_xO_y$), or praceodimum oxide ($Pr_2O_3$).

Referring to FIG. 5, an embedded insulating layer 230 may be disposed on a left side surface of a semiconductor region 220. A gate dielectric film 240 may be disposed on the whole right side surface of the semiconductor region 220. In addition, a gate electrode 250 may be disposed on a portion of a right side surface of the gate dielectric film 240. An interlayer insulating layer 260 may be disposed on and under the gate electrode 250.

The gate dielectric film 240 may include a tunneling insulating layer 242, a charge storage layer 244, and a blocking insulating layer 246, which are sequentially stacked in this order from the right side surface of the semiconductor region 220.

The tunneling insulating layer 242, the charge storage layer 244, and the blocking insulating layer 246 may be substantially identical to the tunneling insulating layer 142, the charge storage layer 144, and the blocking insulating layer 146 illustrated in FIG. 4, respectively.

FIGS. 6 to 16 are cross-sectional views for explaining a method of manufacturing the non-volatile memory device 1000 of FIG. 3, according to an exemplary embodiment of the present inventive concept, wherein the cross-sectional views are obtained by viewing the perspective view of FIG. 3 in the y direction.

Figure 6:
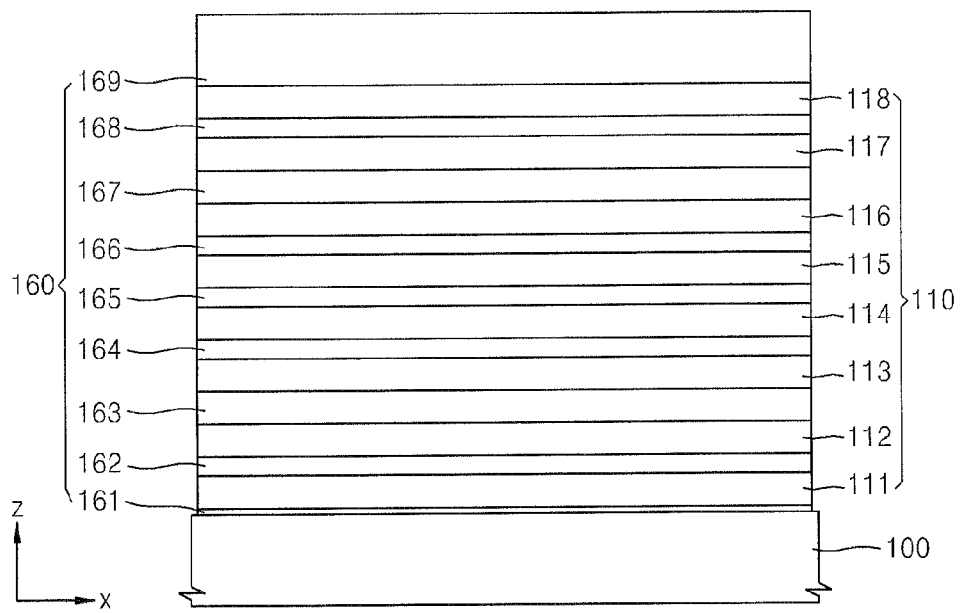
FIGS. 6 to 16 are cross-sectional views for explaining a method of manufacturing the non-volatile memory device of FIG. 3, according to an exemplary embodiment of the present inventive concept.

Referring to FIG. 6, a plurality of interlayer sacrificial layers 111 through 118 (110) and a plurality of interlayer insulating layers 161 through 169 (160) may be alternately deposited on the substrate 100. The interlayer sacrificial layers 110 and the interlayer insulating layers 160 may be alternately deposited on the substrate 100. In this case, a layer that is deposited first on the substrate 100 is the first interlayer insulating layer 161.

The interlayer sacrificial layers 110 may be formed of a material that is etched with etch selectivity with respect to the interlayer insulating layers 160. In other words, the interlayer sacrificial layers 110 may be formed of a material of which etching is minimized when the interlayer sacrificial layers 110 are etched. The etch selectivity may be quantitatively expressed in a ratio of an etch rate of the interlayer sacrificial layers 110 with respect to an etch rate of the interlayer insulating layers 160. For example, the interlayer insulating layers 160 may each include at least one of a silicon oxide film and a silicon nitride film, and the interlayer sacrificial layers 110 may each be a material film different from the interlayer insulating layers 160 selected from a silicon film, a silicon oxide film, a silicon carbide film, and a silicon nitride film.

According to an exemplary embodiment of the present inventive concept, thicknesses of the interlayer insulating layers 160 may not be identical to each other. The thicknesses of the interlayer insulating layers 160 and the interlayer sacrificial layers 110 may be variously changed from the illustrated structure. In addition, the number of films that constitute each of the interlayer insulating layers 160 and the interlayer sacrificial layers 110 may also vary.

Figure 7:
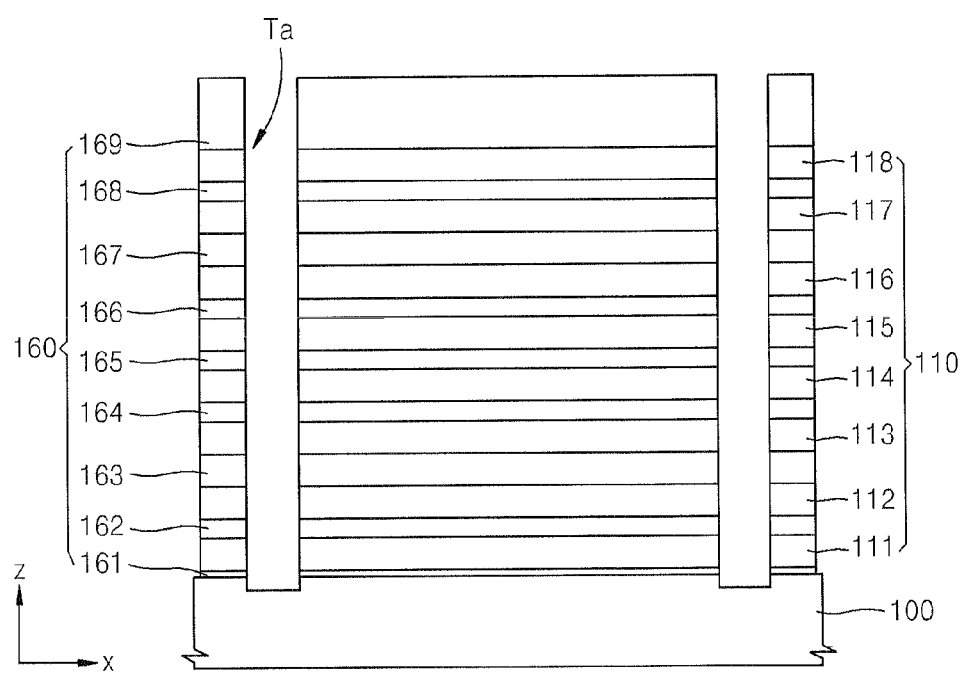

Referring to FIG. 7, first openings Ta may be formed through the alternately stacked interlayer insulating layers 160 and interlayer sacrificial layers 110. The first openings Ta may be holes having a depth in the z direction. However, the structure of the first openings Ta is not limited to this hole structure. In other words, the first openings Ta may instead have various other shapes depending on the structure of a semiconductor region. The first openings Ta may be isolated regions that are spaced apart from each other in the x direction and the y direction (see FIG. 3).

To form the first openings Ta, a predetermined mask pattern (not shown) that defines locations of the first openings Ta is formed on the alternately stacked interlayer insulating layers 160 and interlayer sacrificial layers 110, and the interlayer insulating layers 160 and the interlayer sacrificial layers 110 are anisotropically etched through the mask pattern functioning as an etch mask. Although not illustrated, because a structure including two different films is etched, side walls of the first openings Ta may not be perpendicular to the upper surface of the substrate 100. For example, the closer the first openings Ta are located to the substrate 100, the first openings Ta may have the narrower widths.

The first opening Ta may be formed exposing an upper surface of the substrate 100. The substrate 100 may be over-etched forming a recess having a predetermined depth through the first opening Ta during the anisotropic etching.

Figure 8:
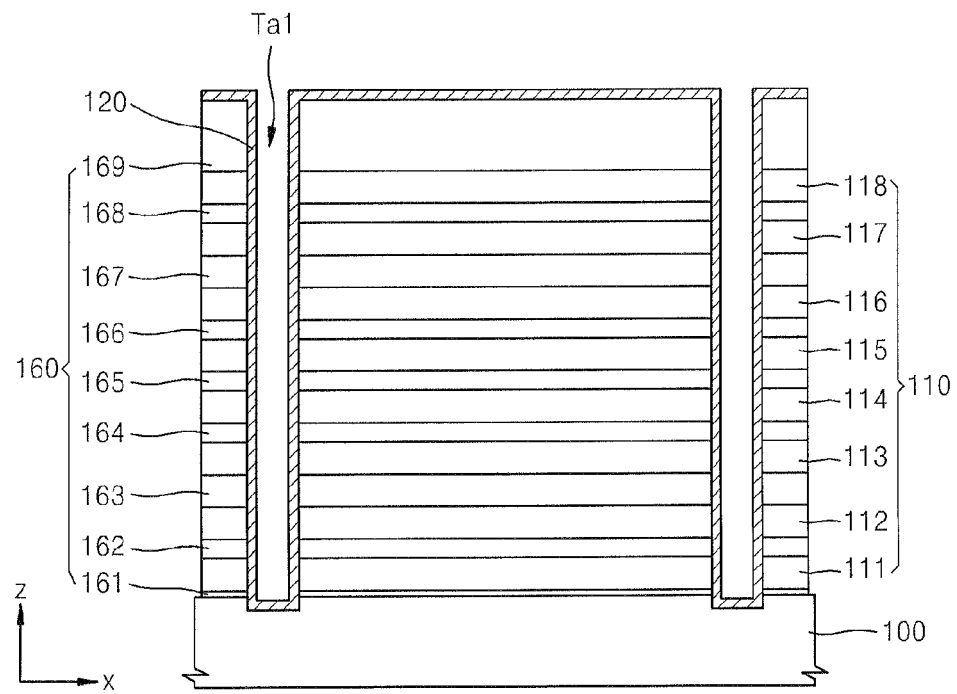

Referring to FIG. 8, the semiconductor region 120 may be formed conformably covering inner walls and a lower surface of the first openings Ta. The semiconductor region 120 may be formed as, for example, a cylinder structure having an open upper portion. In addition, the semiconductor region 120 is not limited to the cylinder structure, and may instead be formed as a square pillar structure, or the semiconductor region 120 may be formed on only opposite side surfaces or a lower surface of the square pillar.

The semiconductor region 120 may be formed by either directly depositing polycrystalline silicon or by depositing amorphous silicon, followed by heat treating to crystallize the amorphous silicon to form polycrystalline silicon. The semiconductor region 120 may be formed by atomic layer deposition (ALD) or CVD. The semiconductor region 120 may be formed to have a predetermined thickness, for example, a fiftieth to a fifth of a width of the first opening Ta. Thus, an inner opening Tai may also be formed inside the semiconductor region 120. In addition, a portion of the semiconductor region 120 formed on a lower surface of the first openings Ta (see FIG. 7) may directly contact the substrate 100, so that the semiconductor region 120 may be electrically connected to the substrate 100.

Figure 9:
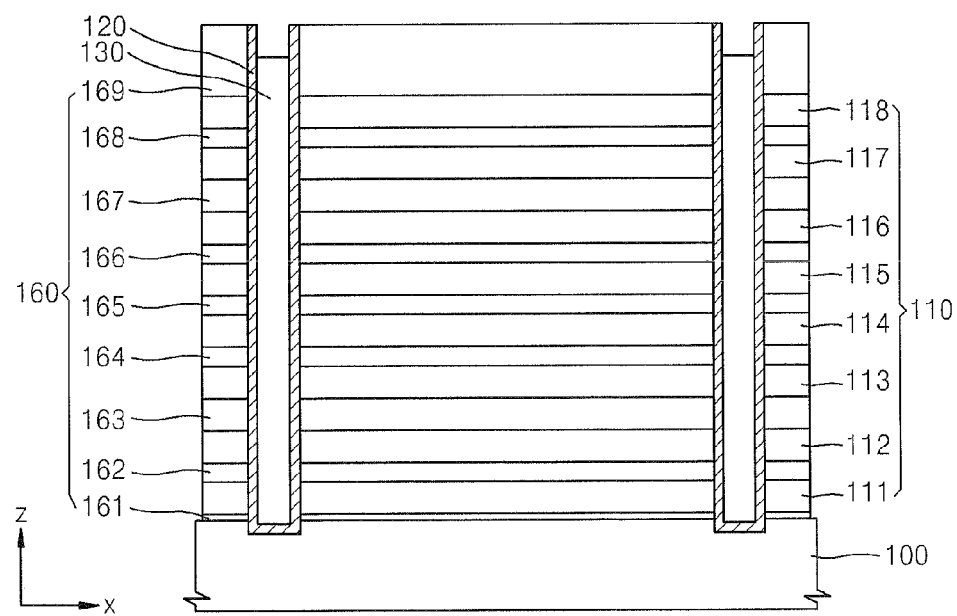

Referring to FIG. 9, the inner opening Tai of the semiconductor region 120 may be filled with the embedded insulating layer 130. Selectively, before the embedded insulating layer 130 is formed, a structure including the semiconductor region 120 may be subjected to hydrogen annealing. In other words, the structure including the semiconductor region 120 may be heat treated in a gas atmosphere including hydrogen or deuterium. Due to the hydrogen annealing, crystal defects present in the semiconductor region 120 may be removed.

Then, a planarization process is performed thereon to remove an unnecessary semiconductor material and insulation material covering the ninth interlayer insulating layer 169, which is the upper most interlayer insulating layer. Thereafter, an upper portion of the embedded insulating layer 130 may be removed by, for example, etching. In other words, the embedded insulating layer 130 may be formed filling up to only a predetermined height of the ninth interlayer insulating layer 169, and not up to an upper surface of the ninth interlayer insulating layer 169.

Figure 10:
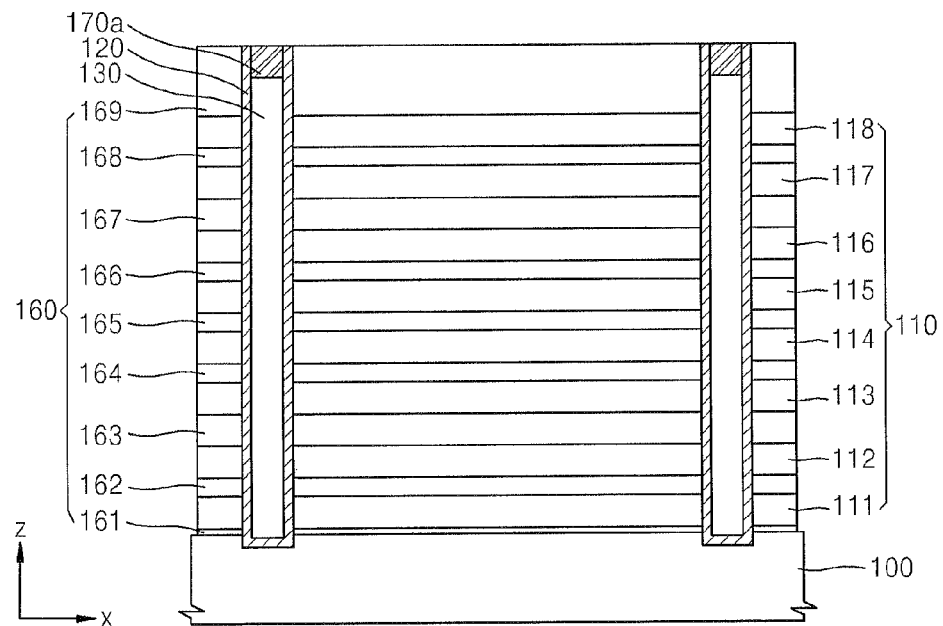

Referring to FIG. 10, a material that forms a first conductive layer 170a is deposited on the resultant structure and then, a planarization process is performed thereon to form the first conductive layer 170a on the region from which the portion of the embedded insulating layer 130 has been removed.

The first conductive layer 170a may be formed on an upper surface of the embedded insulating layer 130 and may be electrically connected to the semiconductor region 120, and may include doped polysilicon and/or undoped polysilicon.

Figure 11:
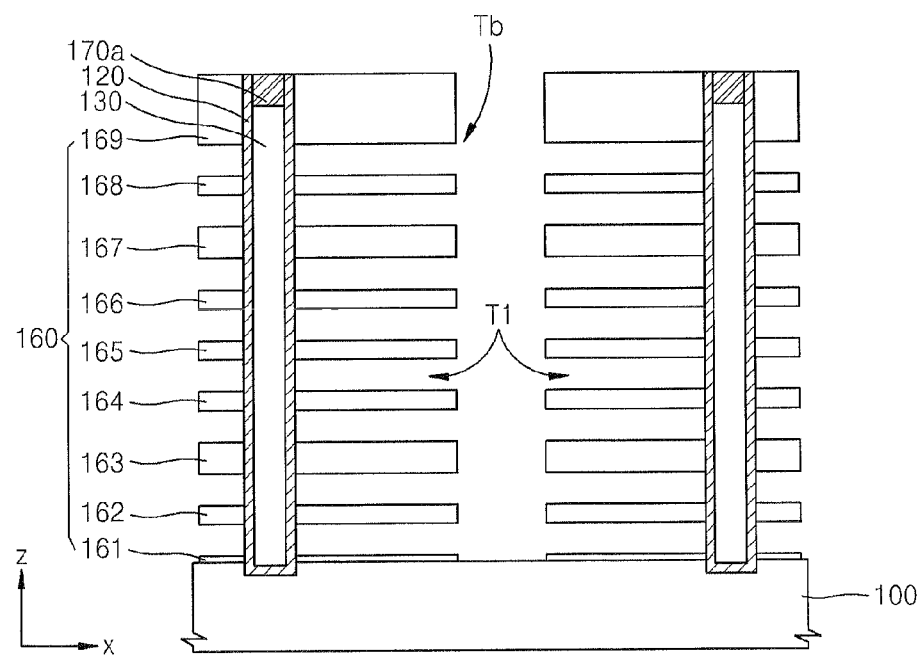

Referring to FIG. 11, second openings Tb may be formed exposing the substrate 100. The second openings Tb may extend in the y direction (see FIG. 3). According to an exemplary embodiment of the present inventive concept, one second opening Tb may be interposed between every two adjacent semiconductor regions 120. However, the present inventive concept may not be limited to the present embodiment, and the location of the semiconductor region 120 and the second opening Tb may vary.

The second opening Tb may be formed by photolithography, and anisotropically-etching the interlayer insulating layers 160, and interlayer sacrificial layers 110. The second opening Tb corresponds to a region that is to become insulation regions (see 185 of FIG. 15) in a follow-up process and extends in the y direction. The interlayer sacrificial layers 110 exposed by the second opening Tb may be removed by wet etching, and thus, a plurality of side surface openings T1 may be formed between the interlayer insulating layers 160. Through the side surface openings T1, portions of side surfaces of the semiconductor region 120 may be exposed.

Figure 12:
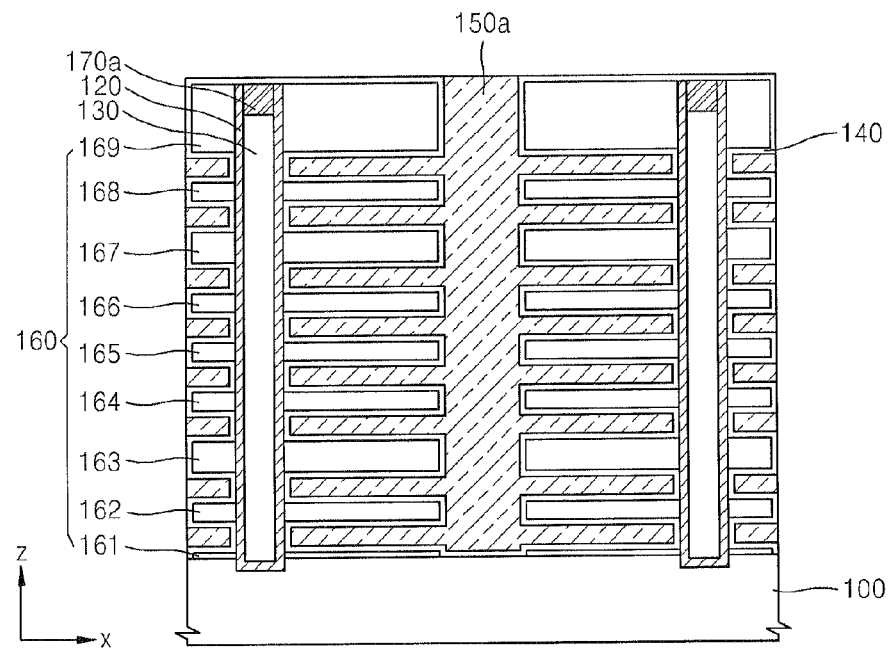

Referring to FIG. 12, the gate dielectric film 140 is formed conformably covering the semiconductor region 120, the interlayer insulating layers 160, and the substrate 100 which are exposed by the second openings Tb (see FIG. 11) and the side surface openings T1 (see FIG. 11).

The gate dielectric film 140 may include, as illustrated in FIG. 4, the tunneling insulating layer 142, the charge storage layer 144, and the blocking insulating layer 146, which are sequentially stacked in this order from the semiconductor region 120. The tunneling insulating layer 142, the charge storage layer 144, and the blocking insulating layer 146 may be formed by ALD or CVD.

Figure 13:
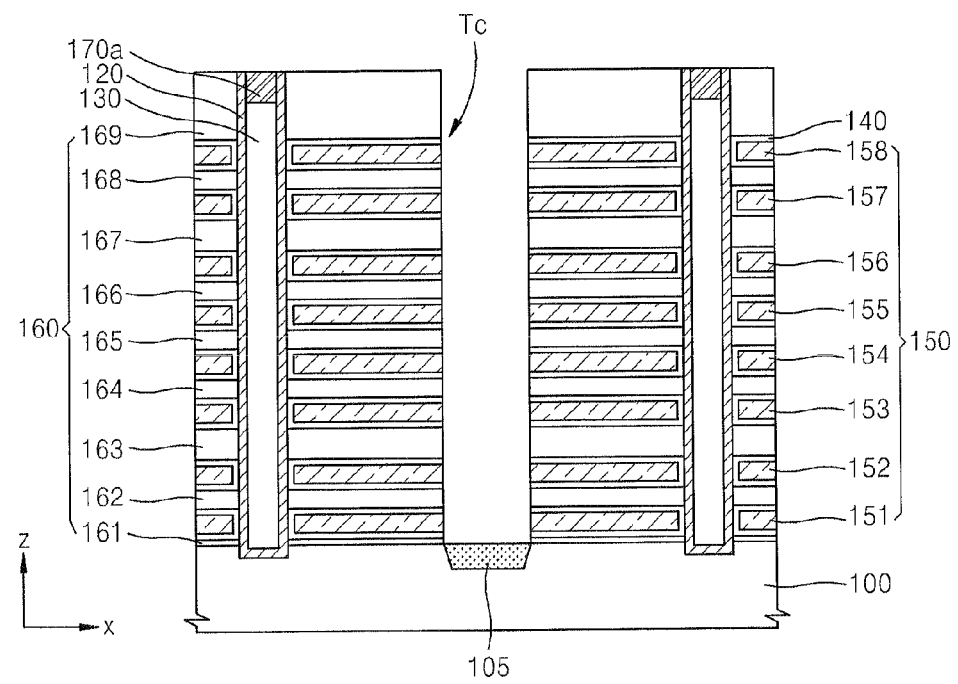

Then, the second openings Tb and the side surface openings T1 are filled with a conductive material 150a. In FIG. 12, the second openings Tb are completely filled with the conductive material 150a. However, the present inventive concept is not limited thereto. For example, when the side surface openings T1 are filled with the conductive material 150a, the conductive material 150a may be deposited on only some of the surfaces exposed by the second openings Tb. Referring to FIG. 13, some of the conductive material 150a may be etched to form a third opening Tc. Thus, the conductive material 150a remains only inside the side surface openings T1 of FIG. 11 to form the gate electrodes 150. The third opening Tc may be formed by anisotropic etching, and the gate dielectric film 140 formed on upper surfaces of the ninth interlayer insulating layer 169 and the substrate 100 may also be removed by anisotropic etching. The gate dielectric films 140 formed on side surfaces of the interlayer insulating layers 160 may also be removed. Selectively, the gate dielectric films 140 formed on the side surfaces of the interlayer insulating layers 160 may not be removed.

Then, an impurity is implanted into the substrate 100 through the third opening Tc to form the impurity region 105. The impurity may be an n-type impurity, such as phosphorous (P), arsenic (As), or antimony (Sb), or a p-type impurity, such as boron (B), aluminum (Al), gallium (Ga), or zinc (Zn). The impurity region 105 may be a source region. The impurity region 105 may have a conductivity identical to or different from that of the substrate 100. If the impurity region 105 has a conductivity different from that of the substrate 100, the impurity region 105 may form a P-N junction with the substrate 100.

According to an exemplary embodiment of the present inventive concept, the impurity regions 105 may be connected to each other to form an equipotential state. According to an exemplary embodiment of the present inventive concept, the impurity regions 105 may be electrically separated from each other to have different potentials. According to an exemplary embodiment of the present inventive concept, the impurity regions 105 may constitute a plurality of independent source groups including a plurality of different impurity regions, and the source groups may be electrically separated from each other to have different potentials.

The impurity region 105 may include a high-concentration impurity region (not shown) that is located near the main surface of the substrate 100 and at the center of the substrate 100, and a low-concentration impurity region (not shown) disposed at both sides of the high-concentration impurity region.

Figure 14:
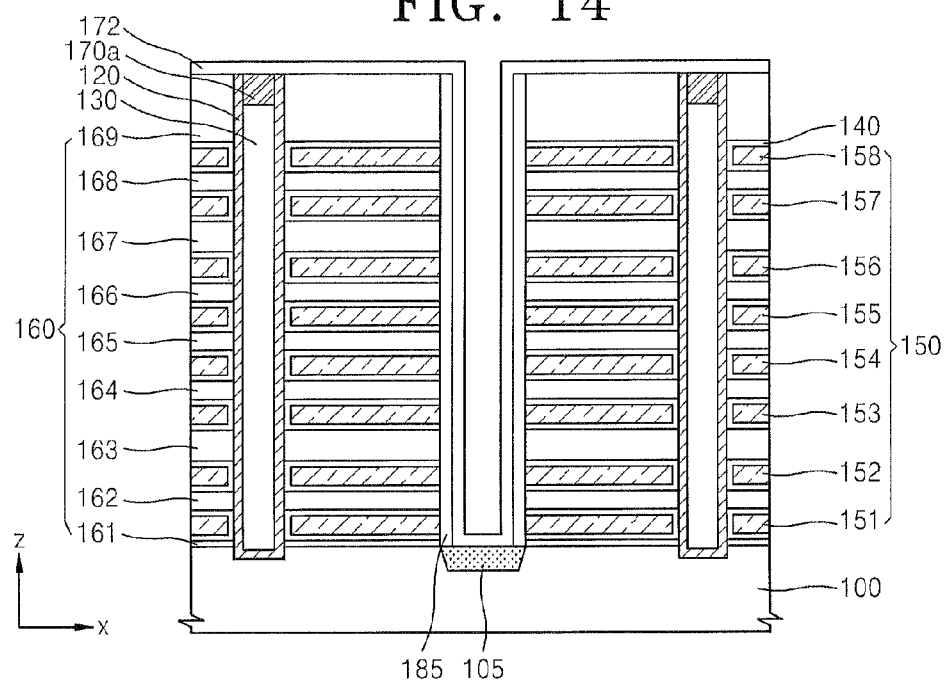

Referring to FIG. 14, the insulation regions 185 may be formed inside the third opening Tc. In other words, the insulation regions 185 are formed on side walls of the interlayer insulating layers 160 and side walls of the gate electrodes 150. The interlayer insulating layers 160 may be formed by using a method that has high corner coverage. For example, CVD, ALD, sputtering, plating, or the like may be used. According to an exemplary embodiment of the present inventive concept, the insulation regions 185 may be formed by filling the third opening Tc with an insulating material, followed by anisotropic etching. The insulation regions 185 may be formed of the same material used in forming the interlayer insulating layers 160.

Then, a metal layer 172 is formed on whole surfaces of the first conductive layer 170a, the ninth interlayer insulating layer 169, the insulation regions 185, and the impurity region 105 to form the second conductive layer 170b. The metal layer 172 may include cobalt (Co), palladium (Pd), platinum (Pt), nickel (Ni), titanium (Ti), molybdenum (Mo), tantalum (Ta), or tungsten (W). The metal layer 172 may have a thickness of, for example, 100 Å to 400 Å. In addition, the illustrated metal layer 172 is formed on upper surfaces of the semiconductor region 120 and the first conductive layer 170a. However, the metal layer 172 is not limited to the illustrated structure. For example, the ninth interlayer insulating layer 169, which is the upper most interlayer insulating layer, can be etched to expose a side surface of the semiconductor region 120, and then the metal layer 172 is formed on the exposed side wall and an upper surface of the semiconductor region 120 and on the upper surface of the first conductive layer 170a.

Selectively, a capping film (not shown) may be formed on the metal layer 172. The structure under the metal layer 172 may retain thermal stability due to the capping film during siliciding, which is described as follows with reference to FIG. 15, and the capping film may prevent oxidation of the metal layer 172.

Figure 15:
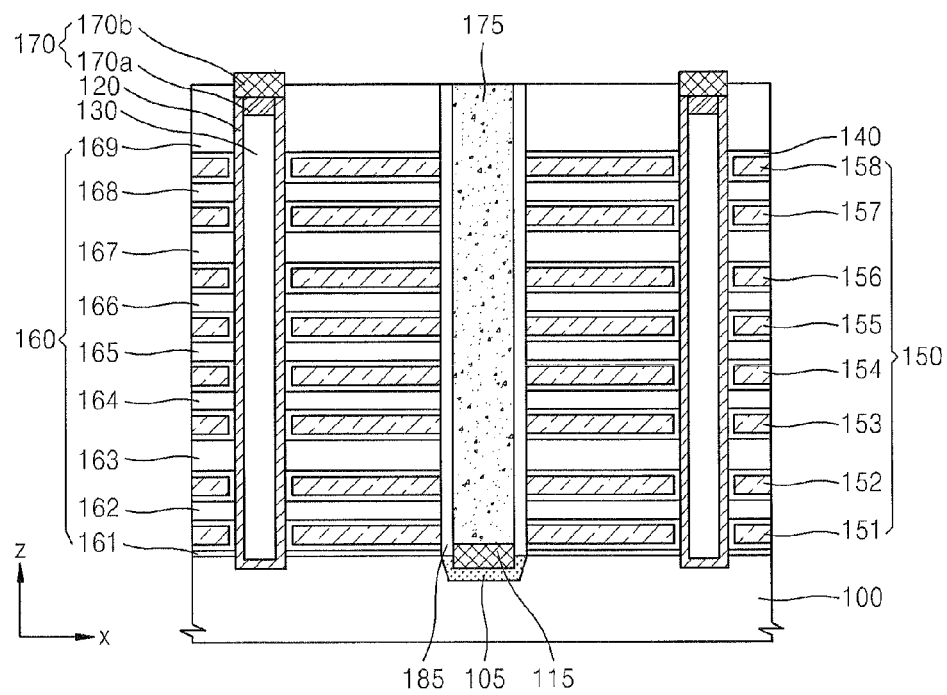

Referring to FIG. 15, a heat treatment process is performed to form the second conductive layers 170b and 115, in other words, a metal silicide layer having a thickness of 100 Å to 300 Å on the first conductive layer 170a and the impurity region 105. The second conductive layer 170b on the first conductive layer 170a is ultimately a part of the first conductive layer 170a, and the second conductive layer 115 on the impurity region 105 is ultimately a part of the impurity region 105. However, the second conductive layers 170b and 115 are distinguished from the first conductive layer 170a and the impurity region 105, respectively. The second conductive layers 170b and 115 may include at least one metal silicide selected from the group consisting of cobalt (Co), palladium (Pd), platinum (Pt), nickel (Ni), titanium (Ti), molybdenum (Mo), tantalum (Ta), and tungsten (W). According to an exemplary embodiment of the present inventive concept, if the first conductive layer 170a does not include polysilicon, the metal silicide layer may not be formed on the first conductive layer 170a.

For example, if the metal layer 172 illustrated in FIG. 14 includes titanium (Ti) or cobalt (Co), the metal layer 172 is heat treated at a temperature of 350° C. to 600° C., and then heat treated at a temperature of 500° C. to 900 ° C., thereby forming a stable phase of silicide.

If the metal layer 172 includes nickel (Ni) or a nickel alloy, a heat treatment process performed at a temperature of 350° C. to 650° C. may be sufficient to form a stable phase of silicide film.

Then, an unreacted portion of the metal layer 172, for example, portions of the metal layer 172 on the surface of the insulation regions 185 and on the ninth interlayer insulating layer 169 are removed by etching. In this case, the second heat treatment on titanium (Ti) or cobalt (Co) may be performed after the etching.

As described herein, because the second conductive layers 170b and 115 formed without photolithography have a self-aligned structure, the second conductive layers 170b and 115 are referred to as a self-aligned silicide or salicide. The second conductive layers 170b and 115 may reduce resistance of source and drain regions. The second conductive layers 170a and 170b may function as drain regions of the string selection transistors S ST1 and SST2. In addition, the second conductive layer 115 may function as a common source line.

In addition, although the second conductive layers 170b and 115 have been described as including a metal silicide layer formed by performing a heat treatment process on the metal layer 172, the second conductive layers 170b and 115 are not limited thereto. For example, without the heat treatment process, the metal layer 172 may be selectively etched to form the second conductive layers 170b and 115 on the first conductive layer 170a and the impurity region 105. In this case, a metal barrier (not shown) may be further included between the first conductive layer 170a and the second conductive layer 170b. In addition, a metal barrier layer (not shown) may be further included between the impurity region 105 and the second conductive layer 115. The metal barrier layers (not shown) may be, for example, Ti/TiN, or the like. However, the metal barrier layers may not be limited thereto.

The conductive layer 170 may include the first conductive layer 170a and the second conductive layer 170b. In addition, because the second conductive layer 170b includes metal or metal silicide, the resistance of the conductive layer 170 is reduced and the contact resistance of bit lines (see FIG. 16) electrically contacting the conductive layer 170 may be reduced.

In addition, compared to a case in which the conductive layer 170 includes only doped polysilicon, an ion implantation process may be minimized or may not be used. Thus, compared to a case in which a high-concentration ion is implanted into the first conductive layer 170a to form a conductive layer, current scattering may be reduced and thus, characteristics of a non-volatile memory device may be improved.

In addition, because the second conductive layers 170b and 115 are respectively formed on the first conductive layer 170a and the impurity region 105 at once, a manufacturing process may be simplified and process costs may be reduced.

Then, an insulating material may be deposited inside of the insulation regions 185 from which the unreacted metal layer 172 has been removed, and then, an etch process, such as an etch-back process, is performed thereon to form the embedded insulating layer 175.

Figure 16:
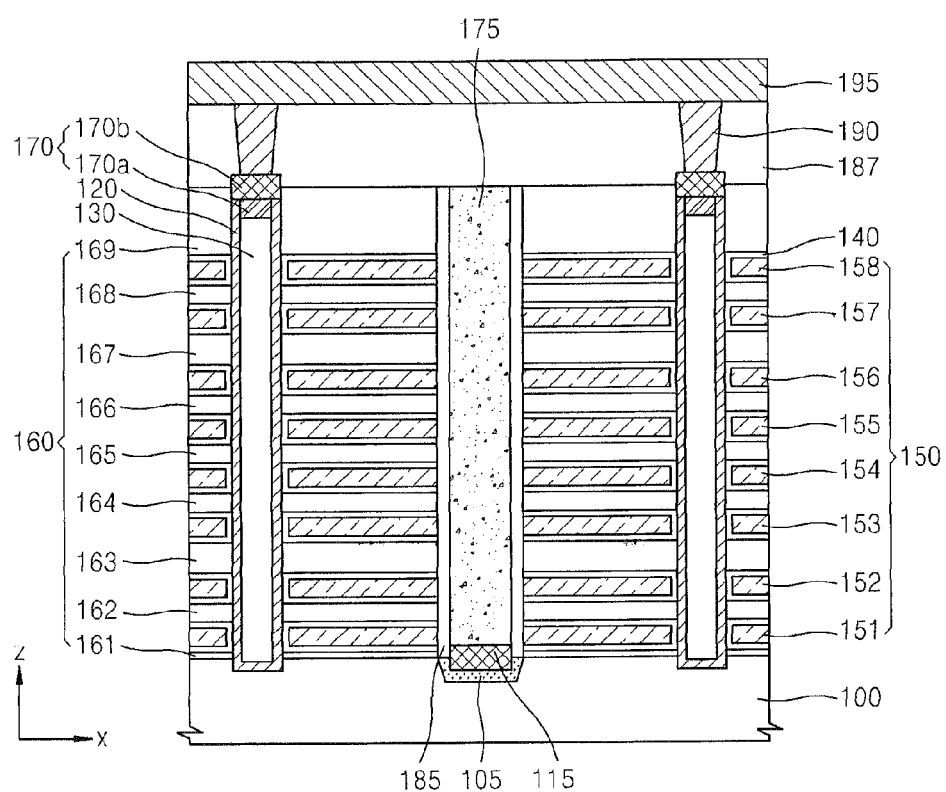

Referring to FIG. 16, an interconnection insulating layer 187 is formed on the conductive layer 170, the ninth interlayer insulating layer 169, and the embedded insulating layer 175. A bit line contact plug 190 may be formed through the interconnection insulating layer 187. To form the bit line contact plug 190, a contact hole is formed by a photolithography process and an etch process, and then, a conductive material may be deposited inside the contact hole.

Then, a bit line 195 may be formed on the interconnection insulating layer 187 to connect the bit line contact plugs 190 arranged in the x direction. The bit line 195 may also be formed as a line shape by a deposition process, a photolithography process, and an etch process.

A non-volatile memory device according to an exemplary embodiment of the present inventive concept may have reduced resistance of the conductive layer 170, reduced resistance between the conductive layer 170 and the bit line 195, improved threshold voltage scattering, and improved endurance.

FIGS. 17 to 22 are cross-sectional views for explaining a method of manufacturing the non-volatile memory device 1000 of FIG. 3, according to an embodiment of the present inventive concept, wherein the cross-sectional views are obtained by viewing the perspective view of FIG. 3 in the y direction. The descriptions made with reference to FIGS. 6 to 16 may not be repeated.

Figure 17:
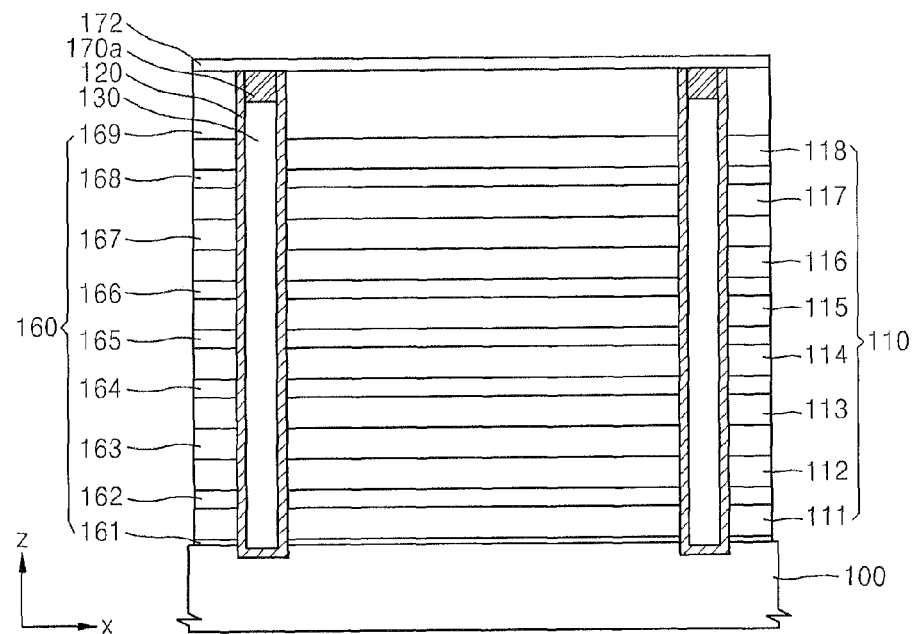
FIGS. 17 to 22 are cross-sectional views for explaining a method of manufacturing the non-volatile memory device of FIG. 3, according to an exemplary embodiment of the present inventive concept.
Figure 18:
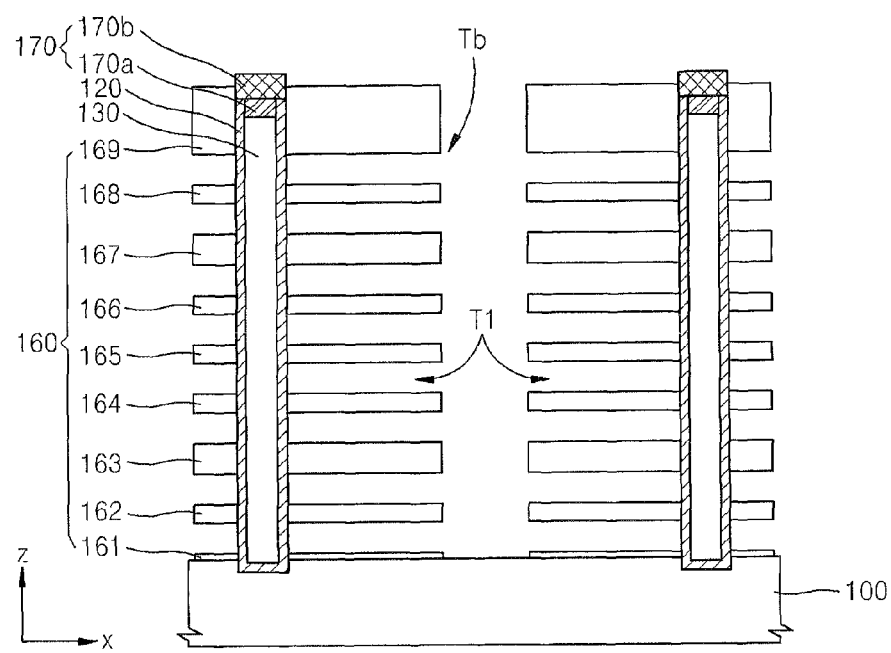

Referring to FIG. 17, the metal layer 172 may be formed on the whole surface of the ninth interlayer insulating layer 169 to form the second conductive layer 170b (see FIG. 18). In addition, the illustrated metal layer 172 is formed on the semiconductor region 120 and on the upper surface of the first conductive layer 170a. However, the metal layer 172 may not be limited thereto. For example, the ninth interlayer insulating layer 169, which is the upper most interlayer insulating layer, may be etched to expose the side surface of the semiconductor region 120 and then, the metal layer 172 may be formed on the exposed side wall and the upper surface of the semiconductor region 120 and the whole surfaces of the first conductive layer 170a, and ninth interlayer insulating layer 169.

The metal layer 172 may include cobalt (Co), palladium (Pd), platinum (Pt), nickel (Ni), titanium (Ti), molybdenum (Mo), tantalum (Ta), or tungsten (W). The metal layer 172 may have a thickness of, for example, 100 Å to 400 Å.

Selectively, a capping film (not shown) may be formed on the metal layer 172. The structure under the metal layer 172 may retain thermal stability due to the capping film during siliciding, which is described as follows with reference to FIG. 18, and the capping film may prevent oxidation of the metal layer 172.

Referring to FIG. 18, a heat treatment process is performed to form a metal silicide layer, in other words, the second conductive layer 170b, having a thickness of 100 Å to 300 Å on the first conductive layer 170a. The second conductive layer 170b on the first conductive layer 170a is ultimately a part of the first conductive layer 170a. However, the second conductive layer 170b is distinguished from the first conductive layer 170a.

The second conductive layer 170b may include at least one metal silicide selected from the group consisting of cobalt (Co), palladium (Pd), platinum (Pt), nickel (Ni), titanium (Ti), molybdenum (Mo), tantalum (Ta), and tungsten (W).

For example, if the metal layer 172 illustrated in FIG. 17 includes titanium (Ti) or cobalt (Co), the metal layer 172 is heat treated at a temperature of 350° C. to 600 ° C., and then heat treated at a temperature of 500° C. to 900° C., thereby forming a stable phase of silicide.

If the metal layer 172 includes nickel (Ni) or a nickel alloy, a heat treatment process performed at a temperature of 350° C. to 650° C. may be sufficient to form a stable phase of silicide film.

In addition, although the second conductive layer 170b has been described as including a metal silicide layer formed by performing a heat treatment process on the metal layer 172, the second conductive layer 170b is not limited thereto. For example, without the heat treatment process, the metal layer 172 may be selectively etched to form the second conductive layer 170b on the first conductive layer 170a.

The conductive layer 170 may include the first conductive layer 170a and the second conductive layer 170b. In addition, because the second conductive layer 170b includes metal or metal silicide, the resistance of the conductive layer 170 may be reduced and the contact resistance of bit lines (see FIG. 22) electrically contacting the conductive layer 170 may be reduced.

Then, the unreacted metal layer 172 on the ninth interlayer insulating layer 169 may be removed by etching. In this case, the second heat treatment performed on titanium (Ti) or cobalt (Co) may be performed after the etching.

Then, second openings Tb exposing the substrate 100 may be formed. The second openings Tb may extend in the y direction (see FIG. 3).

The second openings Tb may be formed by photolithography, and anisotropically-etching the interlayer insulating layers 160 and the interlayer sacrificial layers 110. The second openings Tb correspond to a region that is to become insulation regions 185 (see FIG. 21) in a follow-up process and extends in the y direction. The interlayer sacrificial layers 110 exposed by the second openings Tb may be removed by wet etching, and thus, a plurality of side surface openings T1 may be formed between the interlayer insulating layers 160. Through the side surface openings T1, portions of side surfaces of the semiconductor region 120 may be exposed.

Figure 19:
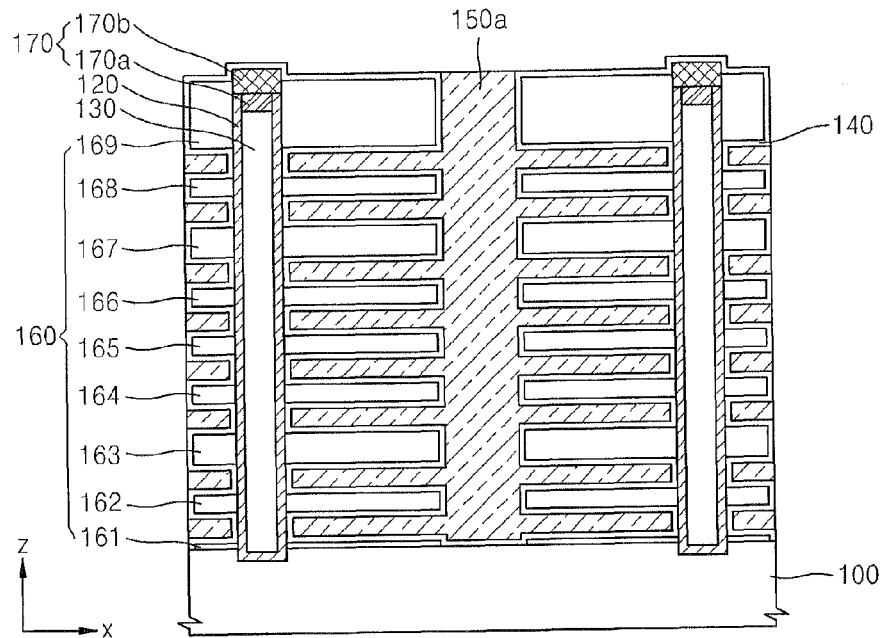

Referring to FIG. 19, the gate dielectric film 140 is formed conformably covering the semiconductor region 120, the interlayer insulating layers 160, and the substrate 100 which are exposed by the second openings Tb and the side surface openings T1.

The gate dielectric film 140 may include, as illustrated in FIG. 4, the tunneling insulating layer 142, the charge storage layer 144, and the blocking insulating layer 146, which are sequentially stacked in this order from the semiconductor region 120.

The tunneling insulating layer 142, the charge storage layer 144, and the blocking insulating layer 146 may be formed by ALD or CVD.

Then, the second openings Tb and the side surface openings T1 may be filled with a conductive material 150a. In FIG. 19, the second openings Tb are completely filled with the conductive material 150a. However, the present inventive concept is not limited thereto. For example, when the side surface openings T1 are filled with the conductive material 150a, the conductive material 150a may be deposited on only some of the surfaces exposed by the second openings Tb.

Figure 20:
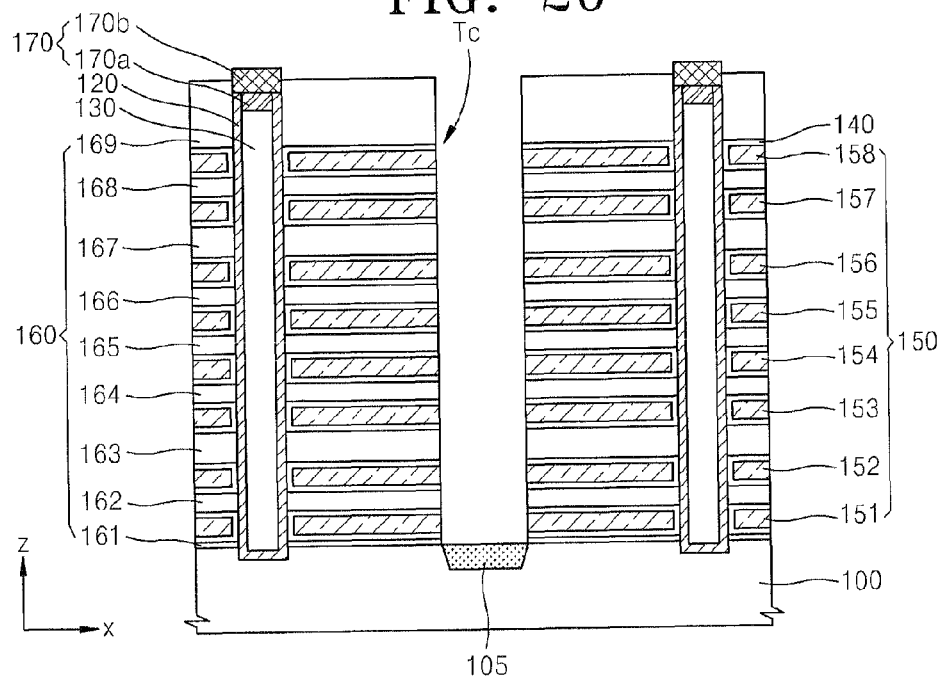

Referring to FIG. 20, some of the conductive material 150a may be etched to form the third opening Tc. Thus, the conductive material 150a remains only inside the side surface openings T1 of FIG. 18 to form the gate electrodes 150. The third opening Tc may be formed by anisotropic etching, and the gate dielectric film 140 formed on upper surfaces of the second conductive layer 170b, the ninth interlayer insulating layer 169, and the substrate 100 may also be removed by anisotropic etching. The gate dielectric films 140 formed on side surfaces of the interlayer insulating layers 160 may also be removed. Selectively, the gate dielectric films 140 formed on the side surfaces of the interlayer insulating layers 160 may not be removed.

Then, an impurity is implanted into the substrate 100 through the third opening Tc to form the impurity region 105. The impurity may be an n-type impurity, such as phosphorous (P), arsenic (As), or antimony (Sb), or a p-type impurity, such as boron (B), aluminum (Al), gallium (Ga), or zinc (Zn). The impurity region 105 may be a source region. The impurity region 105 may have a conductivity identical to or different from that of the substrate 100. If the impurity region 105 has a conductivity different from that of the substrate 100, the impurity region 105 may form a P-N junction with the substrate 100.

According to an exemplary embodiment of the present inventive concept, the impurity regions 105 may be connected to each other to form an equipotential state. According to an exemplary embodiment of the present inventive concept, the impurity regions 105 may be electrically separated from each other to have different potentials. According to an exemplary embodiment of the present inventive concept, the impurity regions 105 may constitute a plurality of independent source groups including a plurality of different impurity regions, and the source groups may be electrically separated from each other to have different potentials.

The impurity region 105 may include a high-concentration impurity region (not shown) that is located near the main surface of the substrate 100 and at the center of the substrate 100, and a low-concentration impurity region (not shown) disposed at both sides of the high-concentration impurity region.

Figure 21:
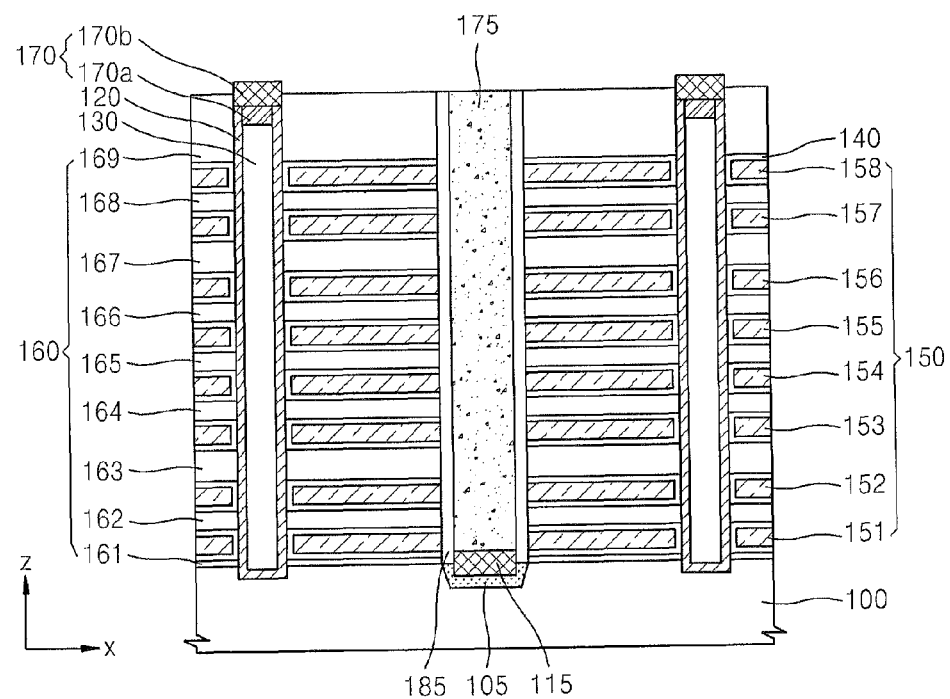

Referring to FIG. 21, the insulation regions 185 and the embedded insulating layer 175 filling the third opening (see Tc of FIG. 20) may be formed. The insulation regions 185 may be formed on side walls of the interlayer insulating layers 160 and side walls of the gate electrodes 150 by using a method that has high corner coverage. For example, CVD, ALD, sputtering, plating, or the like may be used. According to an exemplary embodiment of the present inventive concept, the insulation regions 185 may be formed by filing the third opening Tc with an insulating material, followed by anisotropic etching. The insulation regions 185 may be formed of the same material used in forming the interlayer insulating layers 160.

Then, an insulating material may be deposited inside of the insulation regions 185, and then an etch process, such as an etch-back process, is performed thereon to form the embedded insulating layer 175.

The second conductive layer 115 may be further disposed between the embedded insulating layer 175 and the impurity regions 105. The second conductive layer 115 may include metal or metal silicide. The second conductive layer 115 may function as a common source line. The second conductive layer 115 is formed in the same method as described with reference to FIG. 15 and thus, a description of the method of forming the second conductive layer 115 is omitted.

In the present embodiment, the second conductive layer 170b on the first conductive layer 170a and the second conductive layer 115 on the impurity region 105 are separately formed. By doing so, thicknesses and shapes of the second conductive layers 170b and 115 may be independently controlled, and thus, a process control may be easily performed.

Figure 22:
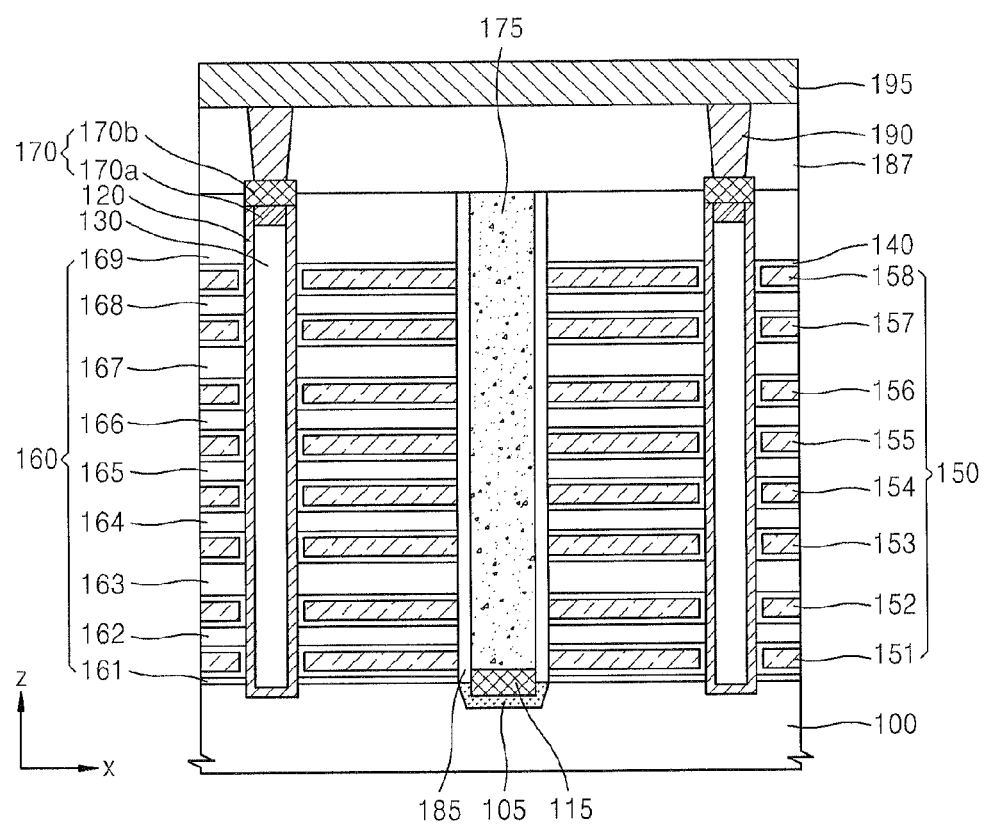

Referring to FIG. 22, the interconnection insulating layer 187 is formed on the conductive layer 170, the ninth interlayer insulating layer 169, and the embedded insulating layer 175, and a bit line contact plug 190 may be formed through the interconnection insulating layer 187.

Then, a bit line 195 may be formed on the interconnection insulating layer 187 to connect the bit line contact plugs 190 arranged in the x direction.

Figure 23:
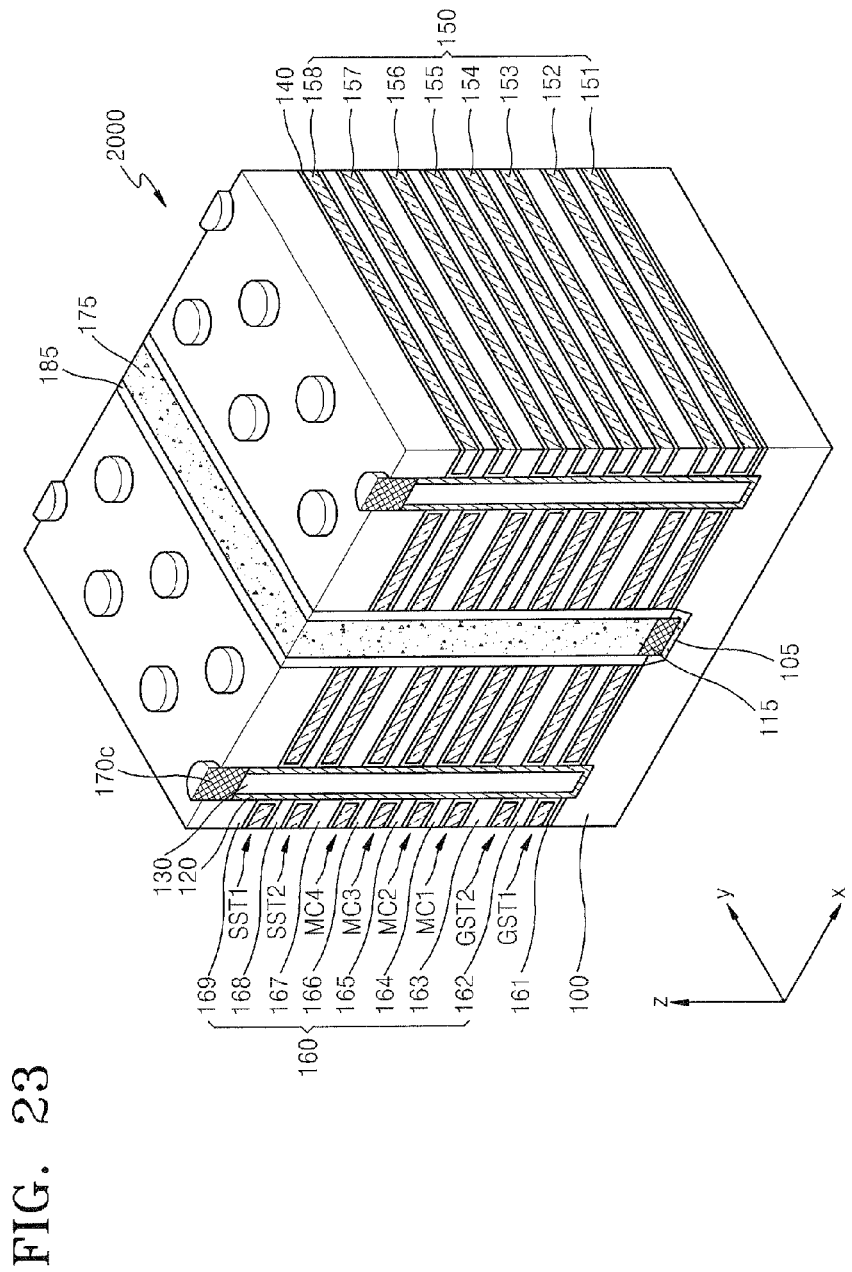
FIG. 23 is a perspective view illustrating a three-dimensional structure of memory cell strings of a non-volatile memory device according to an exemplary embodiment of the present inventive concept.

FIG. 23 is a perspective view illustrating a three-dimensional structure of memory cell strings of a non-volatile memory device 2000 according to an exemplary embodiment of the present inventive concept.

In FIGS. 23 and 3, like reference numerals denote like elements. Accordingly, a description presented with reference to FIG. 3 may not be repeated.

Referring to FIGS. 23, 14, and 15, the non-volatile memory device 2000 according to the present embodiment, in forming a conductive layer 170c, the metal layer 172 is formed on the first conductive layer 170a and then a heat treatment process is performed thereon to form the conductive layer 170c.

By controlling the thickness and the heat treatment temperature of the metal layer 172, the first conductive layer 170a may be completely formed into the conductive layer 170c, in other words, metal silicide. In addition, the semiconductor region 120 surrounding the first conductive layer 170a may also be formed into metal silicide.

In other words, FIG. 23 illustrates a case in which the conductive layer 170c is formed by completely forming the first conductive layer 170a into the conductive layer 170c and forming the portion of the semiconductor region 120 surrounding the first conductive layer 170a into the metal silicide.

Figure 24:
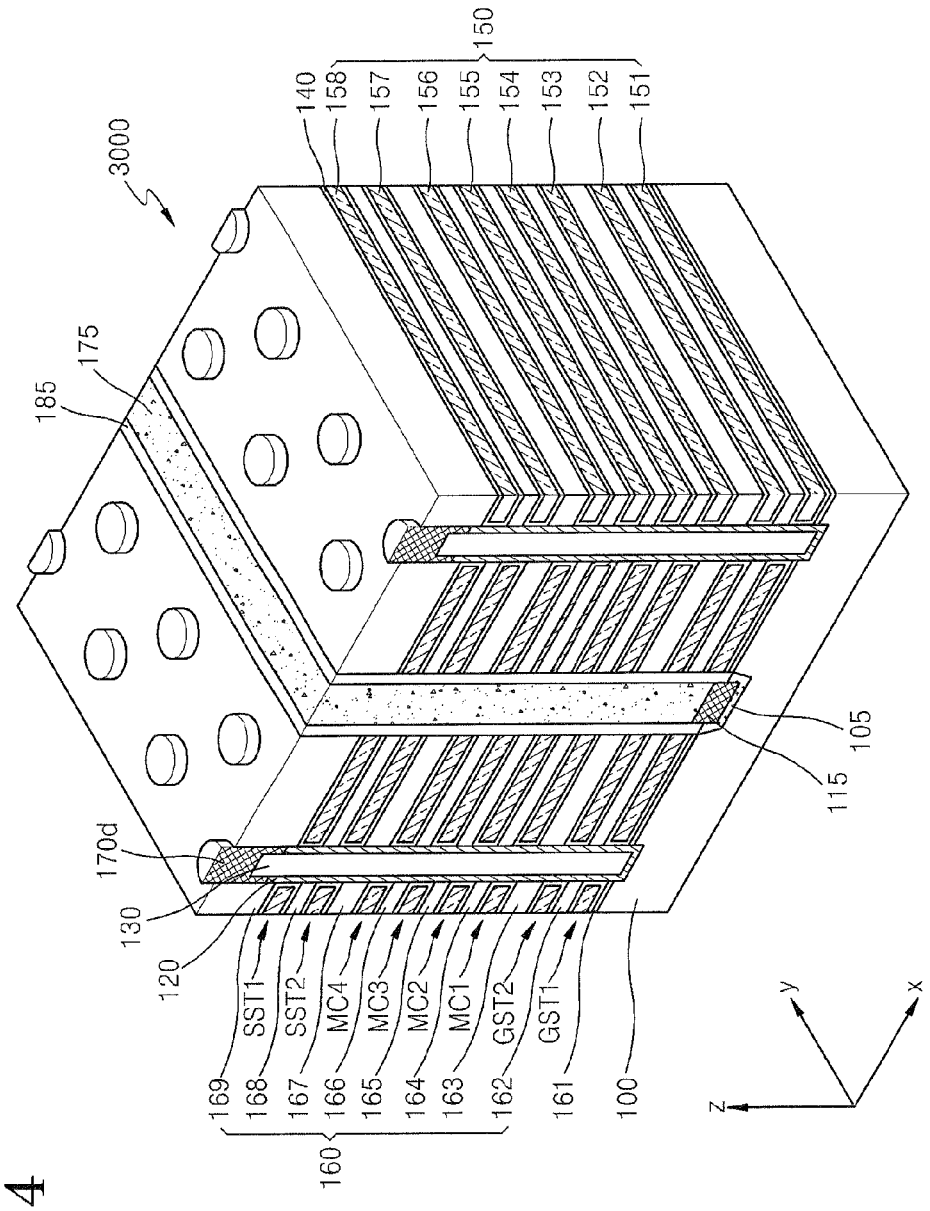
FIG. 24 is a perspective view illustrating a three-dimensional structure of memory cell strings of a non-volatile memory device according to an exemplary embodiment of the present inventive concept.

FIG. 24 is a perspective view illustrating a three-dimensional structure of memory cell strings of a non-volatile memory device 3000 according to an exemplary embodiment of the present inventive concept.

In FIGS. 24 and 3, like reference numerals denote like elements. Accordingly, a description presented with reference to FIG. 3 may not be repeated.

Referring to FIGS. 24, 14, and 15, in the non-volatile memory device 3000 according to the present embodiment, the first conductive layer 170a, the portion of the semiconductor region 120 surrounding the first conductive layer 170a, and a portion of the semiconductor region 120 under the portion of the semiconductor region 120 surrounding the first conductive layer 170a are formed into metal silicide, and thus a conductive layer 170d is formed.

Figure 25:
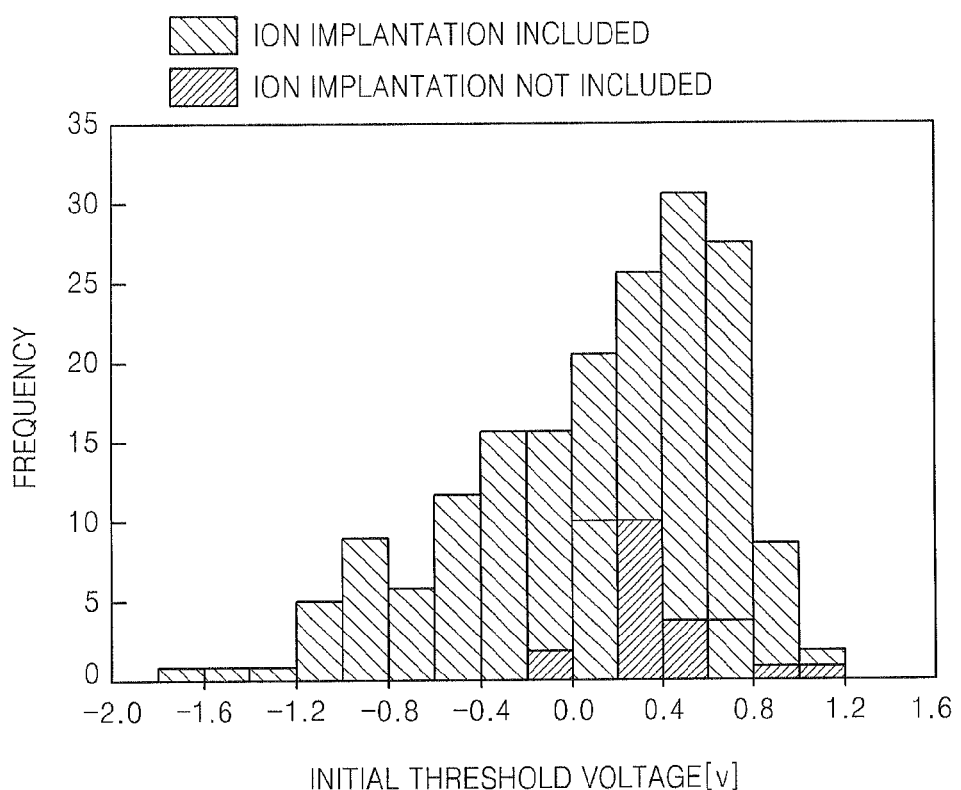
FIG. 25 is a graph for explaining characteristics of a non-volatile memory device formed by using a method of manufacturing a non-volatile memory device according to an exemplary embodiment of the present inventive concept.

FIG. 25 is a graph for explaining characteristics of a non-volatile memory device formed by using a method of manufacturing a non-volatile memory device according to an exemplary embodiment of the present inventive concept.

FIG. 25 illustrates a graph of initial threshold voltage scattering of a case in which without ion implantation, a metal layer is formed on a first conductive layer to form a conductive layer, in other words, metal silicide is formed, according to an exemplary embodiment of the present inventive concept, and a case in which ion implantation was performed on a first conductive layer to form a conductive layer.

It was confirmed that when a metal layer is formed on a first conductive layer to form a metal silicide without ion implantation, scattering of electrical characteristics, such as initial threshold voltage, is reduced compared to when ion implantation is used.

Accordingly, according to a method of manufacturing a non-volatile memory device according to an exemplary embodiment of the present inventive concept, characteristics of non-volatile memory devices may be uniformly maintained. Thus, the endurance of a non-volatile memory device may be improved.

Figure 26:
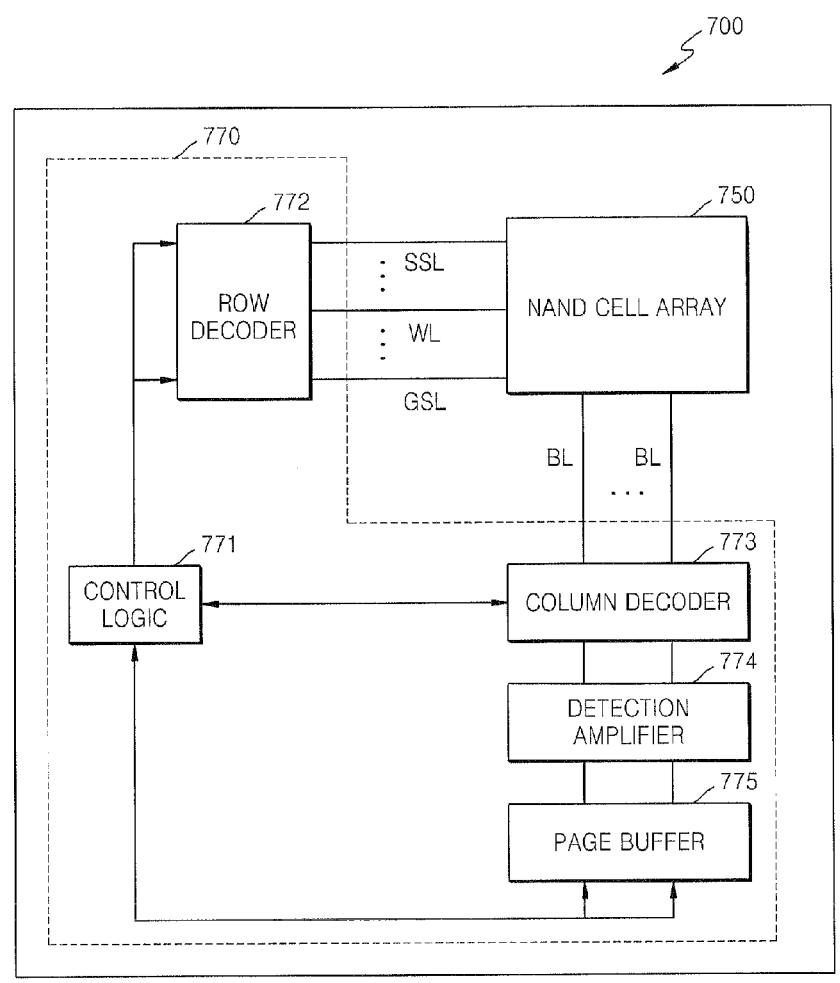
FIG. 26 is a block diagram of a non-volatile memory device according to an exemplary embodiment of the present inventive concept.

FIG. 26 is a block diagram of a non-volatile memory device 700 according to an exemplary embodiment of the present inventive concept.

Referring to FIG. 26, in the non-volatile memory device 700, an NAND cell array 750 may be combined with a core circuit unit 770. For example, the NAND cell array 750 may include any one of the non-volatile memory devices described with reference to FIGS. 3, 23, and 24. The core circuit unit 770 may include a control logic 771, a row decoder 772, a column decoder 773, a detection amplifier 774, and a page buffer 775.

The control logic 771 may communicate with the row decoder 772, the column decoder 773, and the page buffer 775. The row decoder 772 may communicate with the NAND cell array 750 through a plurality of string selection lines SSL, a plurality of word lines WL, and a plurality of ground selection lines GSL. The column decoder 773 may communicate with the NAND cell array 750 through a plurality of bit lines BL. When the NAND cell array 750 outputs signals, the detection amplifier 774 may be connected to the column decoder 773, and when a signal is transmitted to the NAND cell array 750, the detection amplifier 774 may not be connected to the column decoder 773.

For example, the control logic 771 transmits a row address signal to the row decoder 772, and the row decoder 772 decodes the signal and transmits the decoded signal to the NAND cell array 750 through the string selection lines SSL, the word lines WL, and the ground selection lines GSL. The control logic 771 transmits a column address signal to the column decoder 773 or the page buffer 775, and the column decoder 773 decodes the signal and transmits the decoded signal to the NAND cell array 750 through the bit lines BL. The NAND cell array 750 transmits a signal to the detection amplifier 774 through the column decoder 773, and the signal is amplified by the detection amplifier 774 and transmitted to the control logic 771 through the page buffer 775.

Figure 27:
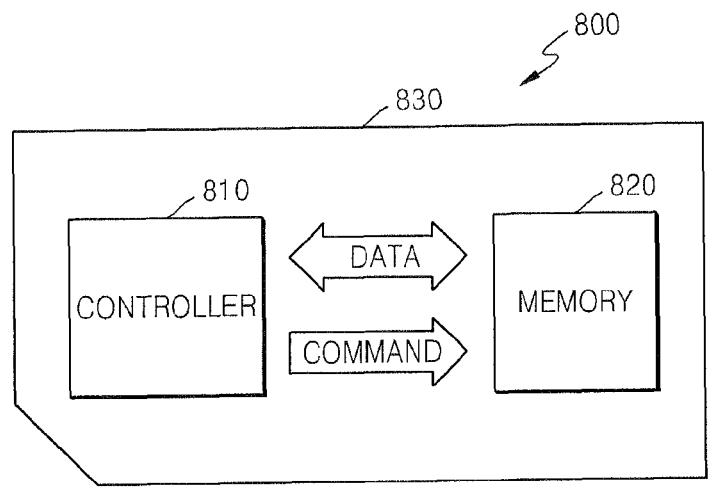
FIG. 27 is a block diagram of a memory card according to an exemplary embodiment of the present inventive concept.

FIG. 27 is a block diagram of a memory card 800 according to an exemplary embodiment of the present inventive concept.

Referring to FIG. 27, the memory card 800 may include a controller 810 and a memory 820 which are installed in a housing 830. The controller 810 and the memory 820 may exchange electrical signals with each other. For example, according to a command from the controller 810, the memory 820 and the controller 810 may exchange data. By doing so, the memory card 800 may store data in the memory 820 or may output data from the memory 820 to the outside.

For example, the memory 820 may include any one of the non-volatile memory devices described with reference to FIGS. 3, 23, and 24. The memory card 800 may be used as a data storage medium for various portable devices. For example, the memory card 800 may include a multi media card (MMC) or a secure digital (SD) card.

Figure 28:
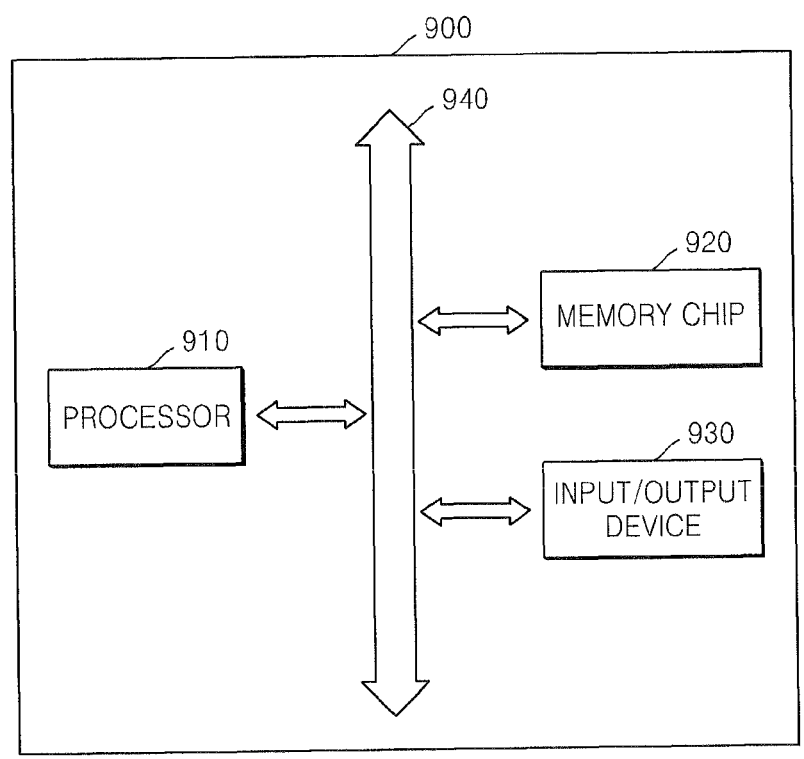
FIG. 28 is a block diagram of an electronic system according to an exemplary embodiment of the present inventive concept.

FIG. 28 is a block diagram of an electronic system 900 according to an exemplary embodiment of the present inventive concept.

Referring to FIG. 28, the electronic system 900 may include a processor 910, an input-output device 930, and a memory chip 920, which data-communicate with each other through a bus 940. The processor 910 may execute a program and controls the electronic system 900. The input-output device 930 may be used to input or output data to or from the electronic system 900. The electronic system 900 may be connected to an external apparatus, for example, a personal computer or a network, through the input-output device 930 to exchange data with the external apparatus. The memory chip 920 may store a code and data for operation of the processor 910. For example, the memory chip 920 may include any one of the non-volatile memory devices described with reference to FIGS. 3, 23, and 24.

The electronic system 900 may constitute various electronic control apparatuses that require the memory chip 920, and may be used in, for example, a mobile phone, an MP3 player, a navigation device, a solid state disk (SSD), a household appliance, or the like.

While the inventive concept has been particularly shown and described with reference to exemplary embodiments thereof, it will be understood by those of ordinary skill in the art that various changes in form and details may be made therein without departing from the spirit and scope of the inventive concept as defined by the following claims.

What is claimed is:

1. A method of manufacturing a non-volatile memory device, the method comprising:
    alternately stacking interlayer sacrificial layers and interlayer insulating layers on a substrate;
    forming a plurality of first openings that pass through the interlayer sacrificial layers and the interlayer insulating layers to expose a first portion of the substrate;
    forming a semiconductor region on a side wall and a lower surface of each of the first openings;
    forming an embedded insulating layer in each of the first openings;
    forming a first conductive layer on the embedded insulating layer inside each of the first openings;
    forming a second opening exposing a second portion of the substrate and forming an impurity region on the second portion;
    forming a metal layer to cover the first conductive layer and the impurity region; and
    forming the metal layer into a metal silicide layer.

2. The method of claim 1, further comprising, between the forming of the metal layer to cover the first conductive layer and the impurity region and the forming of the metal layer into the metal silicide layer,
    forming a capping film on the metal layer.

3. The method of claim 1, wherein the forming of the metal layer into the metal silicide layer comprises
    performing a heat treatment process to form the metal layer on the first conductive layer and the impurity region into the metal silicide layer.

4. The method of claim 3, wherein in the forming of the metal layer on the first conductive layer and the impurity region into the metal silicide layer,
    the first conductive layer is completely or incompletely formed into the metal silicide layer.

5. The method of claim 3, wherein in the forming of the metal layer on the first conductive layer and the impurity region into the metal silicide layer, at least a portion of the first conductive layer and the semiconductor region is formed into the metal silicide layer.

6. The method of claim 3, further comprising:
    forming a bit line that is electrically connected to the metal silicide layer on the first conductive layer; and
    forming an embedded insulating layer on the metal silicide layer on the impurity region.

7. The method of claim 1, further comprising, between the forming of the second opening exposing the second portion of the substrate and the forming of the impurity region on the second portion, forming side surface openings between the interlayer insulating layers by removing the interlayer sacrificial layers exposed by the second opening;

forming a gate dielectric film on a side wall of the second opening and the side surface openings; filling the second opening and the side surface openings with a conductive material; and forming a third opening by removing some of the conductive material and implanting an impurity into the substrate through the third opening to form the impurity region.

8. The method of claim 7, wherein the gate dielectric film comprises a tunneling insulating layer, a charge storage layer, and a blocking insulating layer sequentially stacked in this order from the semiconductor region.

* * * * *